United States Patent
Byun et al.

(10) Patent No.: US 7,750,987 B2
(45) Date of Patent: Jul. 6, 2010

(54) SUBSTRATE FOR A DISPLAY DEVICE, LIQUID CRYSTAL DISPLAY DEVICE HAVING THE SAME AND METHOD OF MANUFACTURING THE SAME

(75) Inventors: Jae-Seong Byun, Suwon-si (KR); Ho-Min Kang, Suwon-si (KR); In-Sung Lee, Seoul (KR); Hoon-Kee Min, Seoul (KR); Sung-Su Hong, Seoul (KR); Ki-Wan Ahn, Goyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1253 days.

(21) Appl. No.: 11/219,240

(22) Filed: Sep. 2, 2005

(65) Prior Publication Data

US 2006/0049403 A1  Mar. 9, 2006

(30) Foreign Application Priority Data

Sep. 3, 2004  (KR) .................. 10-2004-0070388

(51) Int. Cl.
*G02F 1/1368* (2006.01)
(52) U.S. Cl. .................. 349/43; 349/39; 349/187; 257/59; 438/30
(58) Field of Classification Search ............. 349/38, 349/39, 42, 43, 187; 345/92; 257/59, 72; 438/30
See application file for complete search history.

(56) References Cited

U.S. PATENT DOCUMENTS

| 6,130,443 | A | * | 10/2000 | Hong et al. .................. 257/59 |
| 6,362,028 | B1 | | 3/2002 | Chen et al. |
| 6,946,680 | B2 | * | 9/2005 | Jang .................. 257/59 |
| 2002/0115298 | A1 | * | 8/2002 | Cha et al. .................. 438/694 |
| 2002/0117691 | A1 | * | 8/2002 | Choi et al. .................. 257/225 |
| 2002/0151116 | A1 | | 10/2002 | Matsubara |

FOREIGN PATENT DOCUMENTS

CN  1517752  4/2004

* cited by examiner

*Primary Examiner*—Dung Nguyen
*Assistant Examiner*—Tai Duong
(74) *Attorney, Agent, or Firm*—Innovation Counsel LLP

(57) ABSTRACT

A substrate for a display device includes an insulating substrate, a data line, an insulating layer and a pixel electrode. The insulating substrate has a switching element. The data line is formed on the insulating substrate to be electrically connected to a first electrode of the switching element. The insulating layer is formed on the insulating substrate having the switching element and the data line. The insulating layer has a contact hole through which a second electrode of the switching element is partially exposed and a groove adjacent to the data line. The pixel electrode is formed on the insulating layer to be electrically connected to the second electrode through the contact hole. Therefore, an image display quality may be improved, and a manufacturing cost of the LCD device may be reduced.

22 Claims, 32 Drawing Sheets

SUBSTRATE FOR A DISPLAY DEVICE, LIQUID CRYSTAL DISPLAY DEVICE HAVING THE SAME AND METHOD OF MANUFACTURING THE SAME

CROSS-REFERENCE TO RELATED APPLICATION

The present application claims priority from Korean Patent Application No. 2005-70388, filed on Sep. 3, 2004, the disclosure of which is hereby incorporated herein by reference in its entirety.

BACKGROUND

1. Field of the Invention

The present invention relates to a substrate for a display device, a method of manufacturing the substrate, a liquid crystal display (LCD) device having the substrate, and a method of manufacturing the LCD device. More particularly, the present invention relates to a substrate for a display device capable of improving an image display quality, a method of manufacturing the substrate, a liquid crystal display (LCD) device having the substrate, and a method of manufacturing the LCD device.

2. Description of the Related Art

An LCD device includes an array substrate, a counter substrate and a liquid crystal layer. The array substrate includes a thin film transistor (TFT). The liquid crystal layer is interposed between the array substrate and the counter substrate. The arrangement of the liquid crystals in the liquid crystal layer varies in response to an electric field applied thereto. This causes the light transmittance through the liquid crystal layer to change, thereby enabling the LCD device to display images.

The array substrate is manufactured through a plurality of thin film deposition processes, a plurality of photo processes, a plurality of lithography processes, etc.

In order to form a metal line on a substrate, a metal is deposited on the substrate to form a metal thin film. A photoresist film is coated on the metal thin film. An ultraviolet light is irradiated onto the coated photoresist film through a mask. The photoresist film that is exposed by the ultraviolet light is developed to form a photoresist pattern on the metal thin film. The metal thin film is partially etched by using the photoresist pattern as an etching mask to form the metal line. A remaining photoresist film that is on the metal line is then stripped.

When the metal thin film is overetched, the metal line has a shorter width than the photoresist pattern. In addition, when the array substrate is highly integrated, the width of the metal line may be decreased such that an electrical resistance of the metal line is increased, thereby deteriorating an image display quality of the LCD device.

SUMMARY

In accordance with the present invention, a substrate for a display device capable of improving an image display quality is provided.

In accordance with the present invention, a method of manufacturing the above-mentioned substrate is also provided.

In accordance with the present invention, a liquid crystal display (LCD) device having the above-mentioned substrate is also provided.

In accordance with the present invention, a method of manufacturing the above-mentioned LCD device is also provided.

A substrate for a display device in accordance with an embodiment of the present invention includes an insulating substrate, a data line, an insulating layer and a pixel electrode. The insulating substrate has a switching element. The data line is on the insulating substrate to be electrically connected to a first electrode of the switching element. The insulating layer is on the insulating substrate having the switching element and the data line. The insulating layer has a contact hole through which a second electrode of the switching element is partially exposed and a groove adjacent to the data line. The pixel electrode is on the insulating layer to be electrically connected to the second electrode through the contact hole.

A method of manufacturing a substrate for a display device in accordance with an embodiment of the present invention is provided as follows. A switching element and a data line are formed on an insulating substrate. The data line is electrically connected to a first electrode of the switching element. An insulating layer that has a contact hole through which a second electrode of the switching element is partially exposed and a groove adjacent to the data line is formed on the insulating substrate having the switching element and the data line. A pixel electrode electrically connected to the second electrode through the contact hole is formed on the insulating layer.

A liquid crystal display device in accordance with an embodiment of the present invention includes a first substrate, a second substrate and a liquid crystal layer. The second substrate corresponds to the first substrate. The second substrate includes a lower substrate, a switching element, a data line, an insulating layer and a pixel electrode. The switching element is on the lower substrate. The data line is on the lower substrate to be electrically connected to a first electrode of the switching element. The insulating layer is on the lower substrate having the switching element and the data line. The insulating layer has a contact hole through which a second electrode of the switching element is partially exposed and a groove adjacent to the data line. The pixel electrode is on the insulating layer to be electrically connected to the second electrode through the contact hole. The liquid crystal layer is interposed between the first and second substrates.

A method of manufacturing an LCD device in accordance with an aspect of the present invention is provided as follows. A switching element and a data line that is electrically connected to a first electrode of the switching element are formed on a lower substrate. An insulating layer that has a contact hole through which a second electrode of the switching element is partially exposed and a groove adjacent to the data line is formed on the lower substrate having the switching element and the data line. A pixel electrode electrically connected to the second electrode through the contact hole is formed on the insulating layer. An upper substrate corresponding to the lower substrate is formed. A liquid crystal layer is interposed between the pixel electrode and the upper substrate.

A method of manufacturing an LCD device in accordance with another aspect of the present invention is provided as follows. A control electrode of a switching element and a gate line that is electrically connected to the control electrode are formed on a lower substrate. A gate insulating layer is formed on the lower substrate having the control electrode and the gate line. An active layer and a molybdenum layer are formed on the gate insulating layer, in sequence. The active layer and the molybdenum layer are partially etched to form first and second electrodes of the switching element, a data line electrically connected to the first electrode, and a primary active pattern under the first and second electrodes and the data line. The second electrode is spaced apart from the first electrode. An insulating material is deposited on the gate insulating layer having the first and second electrodes, the data line and the primary active pattern. The deposited insulating material corresponding to the second electrode, the deposited insulating material adjacent to the data line and the primary active pattern adjacent to the data line using a first mask are partially etched. A pixel electrode is formed on the insulating layer. The pixel electrode is electrically connected to the second electrode. An upper substrate corresponding to the lower substrate is formed. A liquid crystal layer is interposed between the pixel electrode and the upper substrate.

The insulating layer may comprise, e.g., a passivation layer, an inorganic insulating layer, an organic insulating layer, an overcoating layer, etc. The switching element may comprise, e.g., a thin film transistor (TFT), a metal oxide semiconductor (MOS) transistor, etc. The first and second electrodes may include source/drain electrodes. The control electrode may include a gate electrode.

According to embodiments of the present invention, the data line, the source electrode, the drain electrode and the active pattern are formed using a single mask to simplify a manufacturing process of the LCD device.

In addition, the data line comprises molybdenum, which has a lower electrical resistance than chromium, to decrease an electrical resistance of the data line, thereby improving an image display quality of the LCD device.

Furthermore, the active pattern is formed between the data line and the pixel electrode to decrease an electromagnetic interference between the pixel electrode and the data line so that the width of the data line may be increased. Also, the active pattern between the data line and the pixel electrode may be removed without any additional processing to simplify the manufacturing process of the LCD device so as to decrease a manufacturing cost of the LCD device.

BRIEF DESCRIPTION OF THE DRAWINGS

The above and other advantages of the present invention will become more apparent by describing in detail embodiments thereof with reference to the accompanying drawings, in which.

DESCRIPTION OF THE EMBODIMENTS

Figure 1:
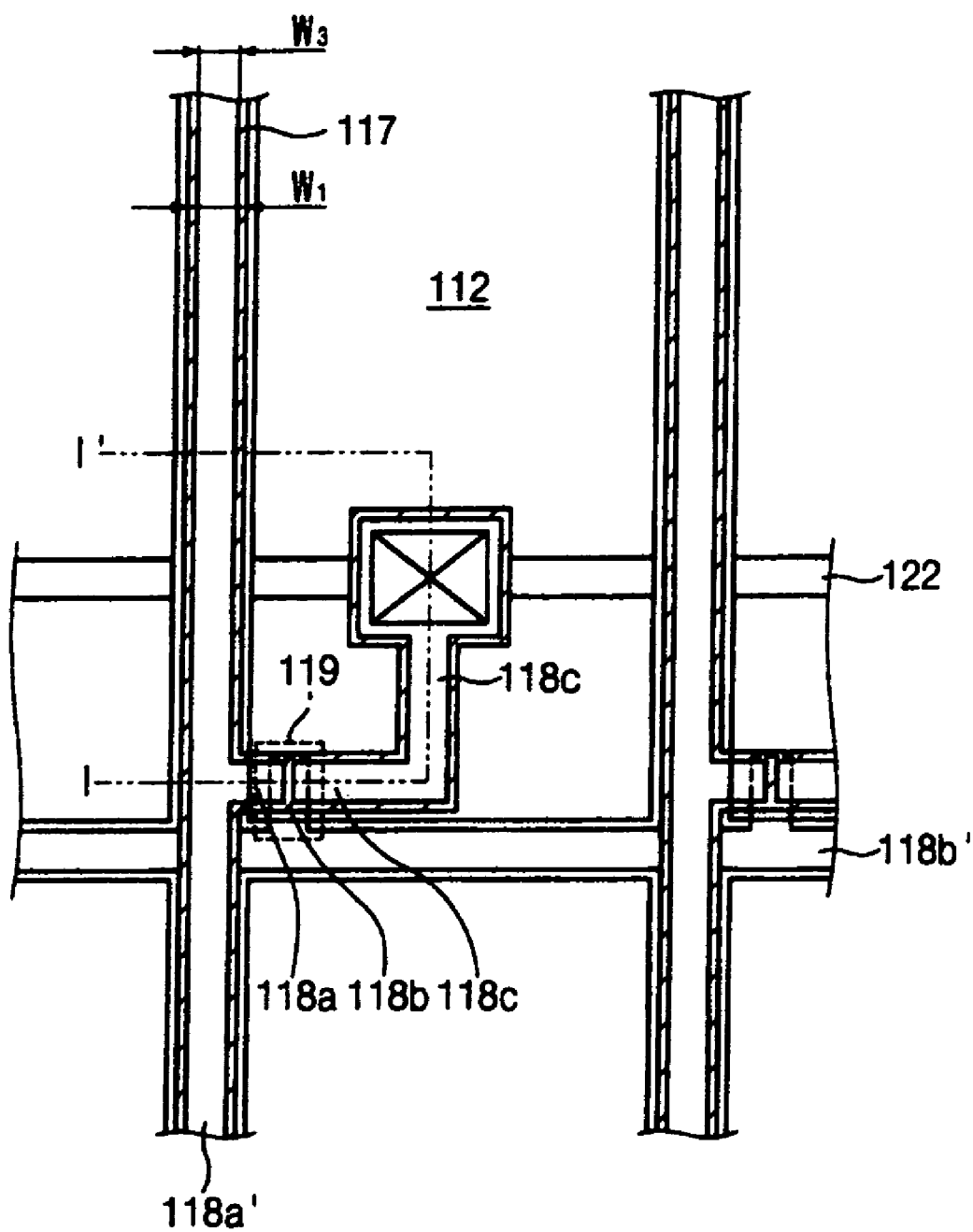
FIG. 1 is a plan view showing a liquid crystal display (LCD) device in accordance with one embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 2:
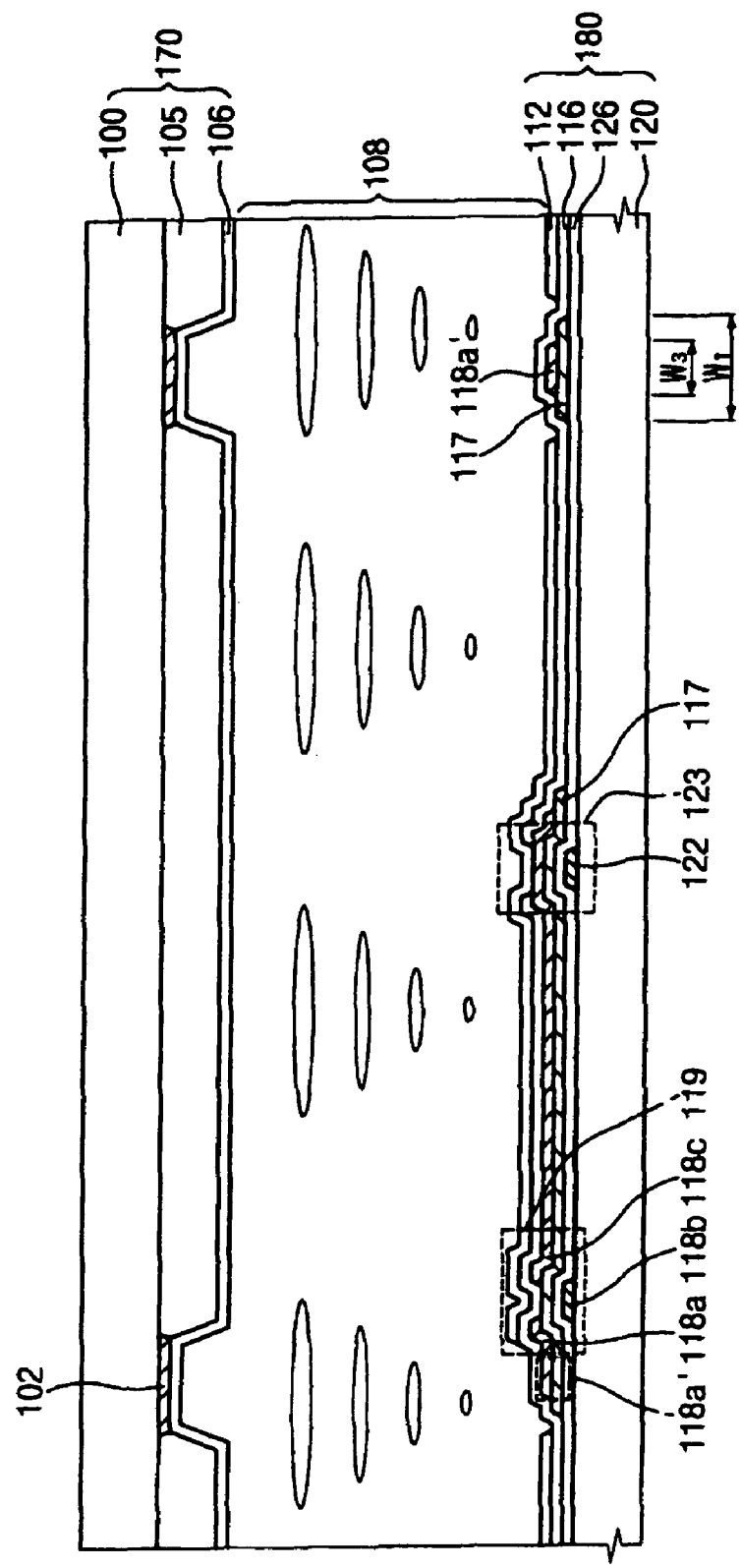
FIG. 2 is a cross-sectional view taken along a line I-I' shown in FIG. 1.

FIG. 1 is a plan view showing a liquid crystal display (LCD) device in accordance with one embodiment of the present invention. FIG. 2 is a cross-sectional view taken along a line I-I' shown in FIG. 1.

Referring to FIGS. 1 and 2, the LCD device includes a first substrate 170, a second substrate 180, a spacer (not shown) and a liquid crystal layer 108.

The first substrate 170 includes an upper substrate 100, a black matrix 102, a color filter 105 and a common electrode 106.

The second substrate 180 includes a lower substrate 120, a thin film transistor (TFT) 119, a gate line 118b', a data line 118a', a storage capacitor 123, a storage capacitor line 122, a gate insulating layer 126, an active pattern 117, a passivation layer 116 and a pixel electrode 112. The gate and data lines 118b' and 118a' define a pixel.

The upper and lower substrates 100 and 120 comprise transparent substrates. The upper and lower substrates 100 and 120 may comprise insulating substrates. Examples of transparent substrates that can be used for the upper and lower substrates 100 and 120 include a glass substrate, a quartz substrate, etc. The light may pass through the transparent glass. The upper and lower substrates 100 and 120 block ultraviolet light. The upper and lower substrates 100 and 120 do not include an alkaline ion. When the upper and lower substrates 100 and 120 include alkaline ions, the alkaline ions may dissolve in the liquid crystal layer 108. This can decrease the resistivity of the liquid crystal layer 108, thereby decreasing an image display quality and an adhesive strength between a sealant and the first or second substrates 100 or 120. In addition, the characteristics of the TFT 119 may also be deteriorated. Furthermore, when the adhesive strength between the sealant and the first or second substrates 100 or 120 is decreased, the LCD device may be broken.

Alternatively, the upper and lower substrates 100 and 120 may also comprise a transparent resin. Examples of transparent resins that can be used for the upper and lower substrates 100 and 120 include triacetylcellulose (TAC), polycarbonate (PC), polyethersulfone (PES), polyethyleneterephthalate (PET), polyethylenenaphthalate (PEN), polyvinylalcohol (PVA), polymethylmethacrylate (PMMA), cyclo-olefin polymer (COP), etc. These materials can be used alone or in combination.

The upper and lower substrates 100 and 120 may be optically isotropic. Alternatively, the upper and lower substrates 100 and 120 may be optically anisotropic.

The black matrix 102 is provided on the upper substrate 100 to selectively block light. The black matrix 102 blocks the light passing through a region in which the liquid crystal is uncontrollable, thereby improving the image display quality.

A metallic material or an opaque organic material may be coated on the upper substrate 120 and partially removed to form the black matrix 102. The metallic material of the black matrix 102 may comprise chromium (Cr), chromium oxide (CrOx), chromium nitride (CrNx), etc. These materials can be used alone or in combination. The opaque organic material may comprise carbon black, a pigment compound, a colorant compound, etc. These materials can be used alone or in combination. The pigment compound may comprise a red pigment, a green pigment and a blue pigment, and the red, green and blue pigments are mixed to form an opaque compound. The colorant compound may comprise a red colorant, a green colorant and a blue colorant, and the red, green and blue colorants are mixed to form an opaque compound. Alternatively, a photoresist film containing the opaque organic material may be coated on the upper substrate 100 to form the black matrix 102 through a photo process against the photoresist film. The edges of a plurality of the color filters may also be overlapped with one another to form the black matrix 102.

The color filter 105 is formed on the upper substrate 100 having the black matrix 102 so that internally and externally provided light having a predetermined wavelength may pass through the color filter 105. The color filter 105 may comprise a photo initiator, a monomer, a binder, a pigment, a dispersant, a solvent, a photoresist, etc. The color filter 105 may be provided on the lower substrate 120 or the passivation layer 116.

The common electrode 106 is formed on the upper substrate 100 having the black matrix 102 and the color filter 105. The common electrode 106 comprises a transparent conductive material such as, for example, indium tin oxide (ITO), amorphous indium tin oxide (a-ITO), tin oxide (TO), indium zinc oxide (IZO), amorphous indium zinc oxide (a-IZO), zinc oxide (ZO), indium tin zinc oxide (ITZO), etc. Alternatively, the common electrode 106 may be substantially in parallel with the pixel electrode 112.

The spacer (not shown) is formed on the upper substrate 100 having the black matrix 102, the color filter 105 and the common electrode 106. The first substrate 170 is spaced apart from the second substrate 180 by the spacer (not shown). In the LCD device of FIGS. 1 and 2, the spacer (not shown) is located at a position corresponding to the black matrix 102, and has a columnar shape. Alternatively, the spacer (not shown) may comprise a ball shaped spacer or a combination of the column shaped spacer and the ball shaped spacer.

The TFT 119 is provided in the pixel region of the lower substrate 120, and includes a source electrode 118a, a gate electrode 118b, a drain electrode 118c and a semiconductor layer pattern. A driving integrated circuit (not shown) applies the source electrode 118a with a data voltage through the source line 118a', and applies the gate electrode 118b with a gate signal through the gate line 118b'. In the LCD device of FIGS. 1 and 2, the source electrode 118a, the drain electrode 118c and the data line 118a' include chromium (Cr).

The gate insulating layer 126 is formed over the lower substrate 120 such that the gate electrode 118b and the storage capacitor line 122 are electrically insulated from the source electrode 118a and the drain electrode 118c. The gate insulating layer 126 may comprise silicon oxide ($SiO_x$), silicon nitride ($SiN_x$), etc. These materials can be used alone or in combination.

The active pattern 117 is provided on the gate insulating layer, and comprises an amorphous silicon layer and an N+ amorphous silicon layer on the amorphous silicon layer. The active pattern 117 between the source electrode 118a and the drain electrode 118c forms a semiconductor layer pattern. When a voltage difference is formed between the gate electrode 118b and the source electrode 118a, a channel is formed in the semiconductor layer pattern such that a current may flow between the source electrode 118a and the drain electrode 118c. In the LCD device of FIGS. 1 and 2, a width $W_1$ of the active pattern 117 is greater than a width $W_3$ of the data line 118a'. The source electrode 118a, the drain electrode 118c and the data line 118a' are provided on the active pattern 117.

The passivation layer 116 is provided on the gate insulating layer 126 and has a contact hole through which the drain electrode 118c is partially exposed. The passivation layer 116 may comprise silicon oxide ($SiO_x$), silicon nitride ($SiN_x$), etc. Alternatively, the passivation layer 116 may comprise a transparent organic material. These materials can be used alone or in combination.

The pixel electrode 112 is formed on the passivation layer 116 in the pixel region and on an inner surface of the contact hole to be electrically connected to the drain electrode 118c. When the voltages are applied to the common electrode 106 and the pixel electrode 112, the liquid crystal of the liquid crystal layer 108 is controlled so that the light transmittance of the liquid crystal layer 108 is changed. The pixel electrode 112 comprises a transparent conductive material such as indium tin oxide (ITO), amorphous indium tin oxide (a-ITO), tin oxide (TO), indium zinc oxide (IZO), amorphous indium zinc oxide (a-IZO), zinc oxide (ZO), indium tin zinc oxide (ITZO), etc. These materials can be used alone or in combination. Alternatively, the pixel electrode may comprise a transparent electrode having the transparent conductive material, and a reflection electrode having a reflective material.

The pixel electrode 112 is spaced apart from the active pattern 117 by a predetermined distance. The active pattern 117 is electrically conductive. When the pixel electrode 112 is adjacent to the active pattern 117, an electromagnetic interference is formed between the pixel electrode 112 and the data line 118a' formed on the active pattern 117, thereby deteriorating the image display quality of the LCD device.

The storage capacitor line 122, a portion of the pixel electrode 112 corresponding to the storage capacitor line 122 and a portion of the gate insulating layer 126 interposed between the storage capacitor line 122 and the pixel electrode 112 form the storage capacitor 123. The storage capacitor 123 maintains a voltage difference between the pixel electrode 112 and the common electrode 106. The common voltage is applied to the storage capacitor line 122.

The first and second substrates 170 and 180 may further include alignment layers (not shown), respectively, to align the liquid crystal of the liquid crystal layer 108.

The liquid crystal layer 108 is interposed between the first and second substrates 170 and 180, and sealed by a sealant (not shown). The liquid crystal layer 108 may comprise liquid crystals having, e.g., a vertical alignment (VA) mode, a twisted nematic (TN) mode, a mixed twisted nematic (MTN) mode, or a homogeneous alignment mode.

FIGS. 3 to 12 are cross-sectional views showing manufacturing of the LCD device shown in FIG. 1.

Figure 3:
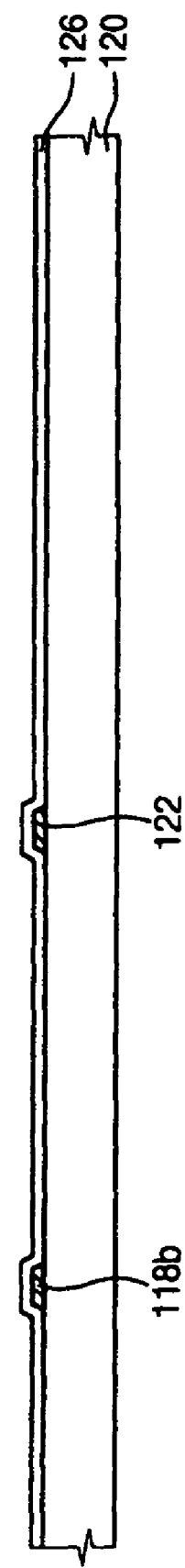
FIGS. 3 to 12 are cross-sectional views showing the LCD device shown in FIG. 1.

Referring to FIG. 3, a conductive material is deposited on the lower substrate 120. The conductive material may comprise a metal such as molybdenum, chromium, copper, etc. The deposited conductive material is partially removed to form the gate electrode 118b, the gate line 118b' and the storage capacitor line 122. The gate insulating layer 126 is deposited on the lower substrate 120 having the gate electrode 118b, the gate line 118b' and the storage capacitor line 122.

Figure 4:
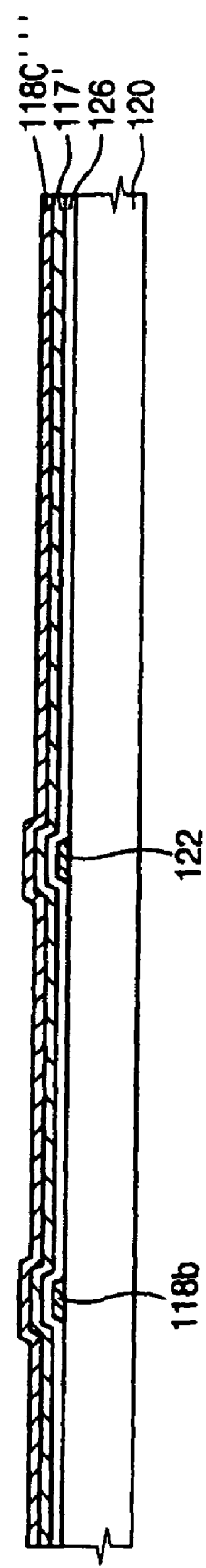

Referring to FIG. 4, an amorphous silicon layer is deposited on the gate insulating layer 126. N+ ions are implanted on the deposited amorphous silicon to form the active layer 117' including the amorphous silicon layer and the N+ amorphous silicon layer. Chromium is deposited on the active layer 117' to form the chromium layer 118c'''.

Figure 5:
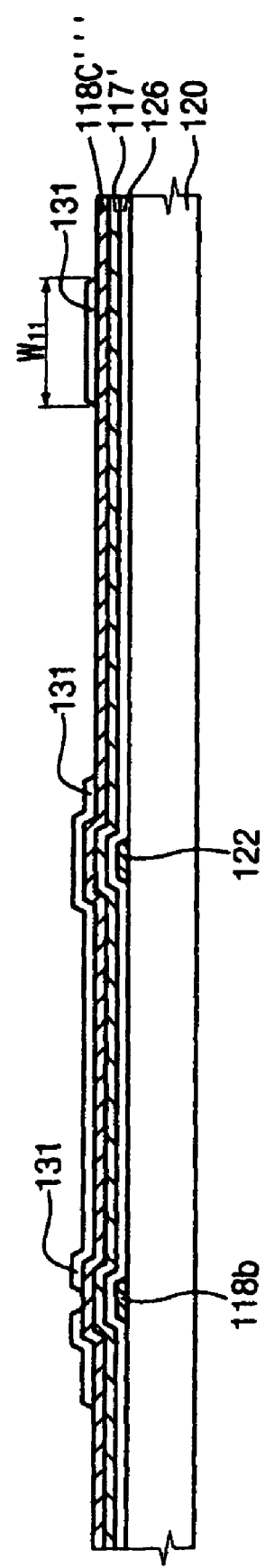

Referring to FIGS. 2 and 5, a photoresist film is coated on the chromium layer 118c'''. The coated photoresist film is exposed through a mask, and developed to form photoresist patterns 131 on the chromium layer 118c'''. The photoresist patterns 131 correspond to the source electrode 118a, the drain electrode 118c and the data line 118a'. The mask for the photoresist patterns 131 includes reticles corresponding to the source electrode 118a, the drain electrode 118c and the data line 118a', respectively.

Figure 6:
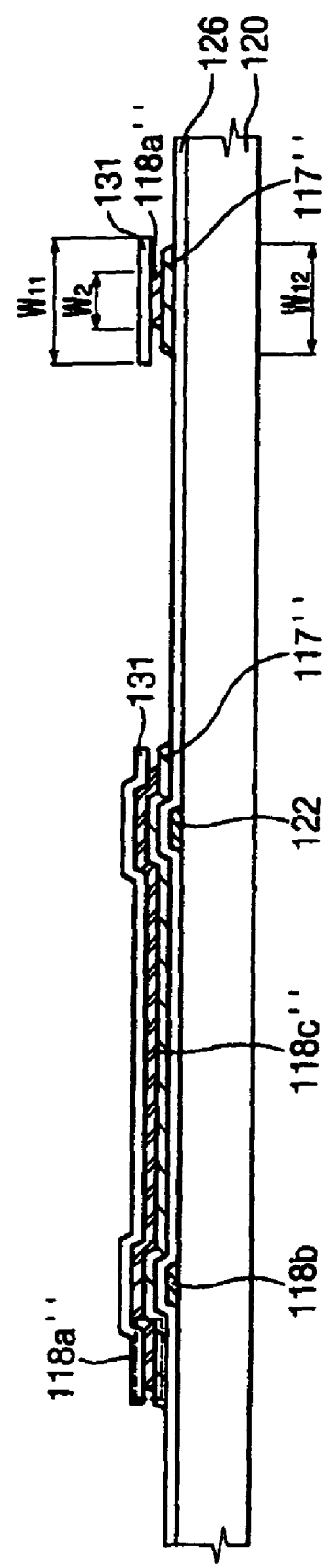

Referring to FIG. 6, the active layer 117' and the chromium layer 118c''' are partially etched using the photoresist patterns 131 as an etching mask to form a primitive active layer 117'', a primary data line 118a'' and a primary source/drain electrode 118c'' under the photoresist patterns 131. The active layer 117' and the chromium layer 118c''' are vulnerable to an etchant of the etching process so that a portion of the primary data line 118a'' and the primary active layer 117'' are recessed with respect to the photoresist patterns 131. Therefore, a width $W_2$ of the primary data line 118a'' and a width $W_{12}$ of the active layer 117'' are less than a width $W_{11}$ of the photoresist patterns 131. The amorphous silicon in the active layer 117' has a lower etch resistance than the chromium in the chromium layer 118c''' so that the width $W_{12}$ of the primary active layer 117'' is less than a width $W_2$ of the primary data line 118a''.

Figure 7:
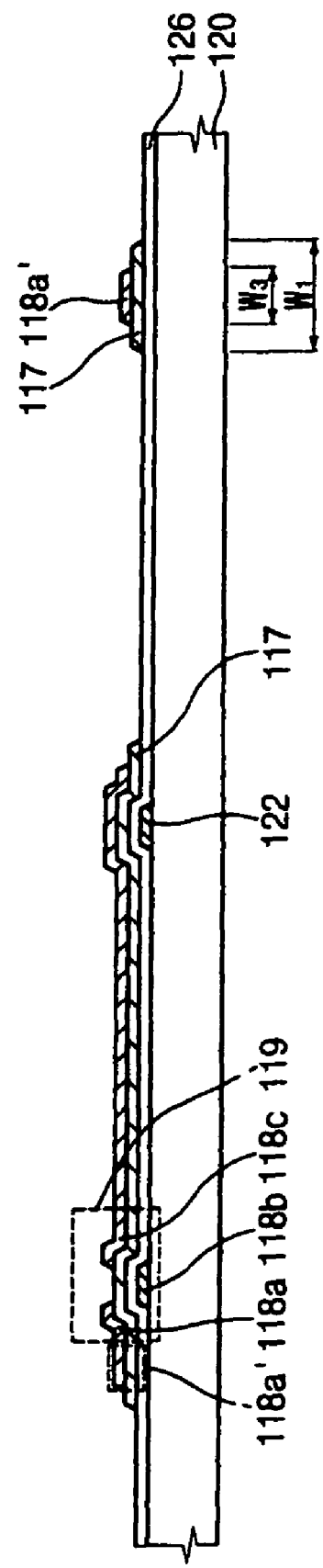

Referring to FIG. 7, the photoresist patterns 131 on the primary data line 118a'' and the primary source/drain electrode 118c'' are removed. The primary source/drain electrode 118c'' corresponding to the gate electrode 118b is etched to form the source electrode 118a and the drain electrode 118c. This concludes formations of the TFT 119 having the source electrode 118a, the gate electrode 118b, the drain electrode 118c and the semiconductor layer pattern.

Sides of the primary data line 118a'' and the primary active layer 117'' are etched to form the data line 118a' and the active pattern 117 while the primary source/drain electrode 118c'' is partially etched. The width $W_3$ of the data line 118a' is less than the width $W_2$ of the primary data line 118a''. The width $W_1$ of the active pattern 117 that is under the data line 118a' is less than a width $W_{12}$ of the primary active layer 117''. The N+ amorphous silicon layer of the active pattern 117 between the source electrode 118a and the drain electrode 118c is then partially removed. The N+ amorphous silicon layer between the source electrode 118a and the drain electrode 118c may be etched with the etching process of the primary source/drain electrode 118c".

Figure 8:
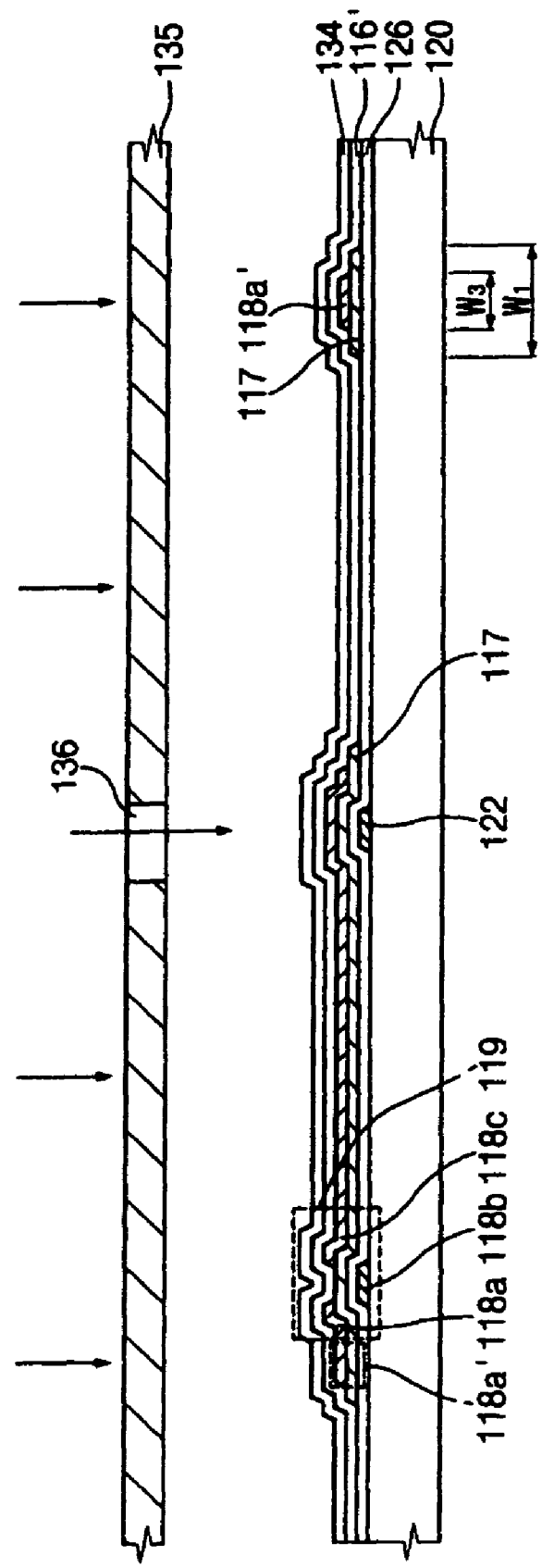

Referring to FIG. 8, a transparent insulating material 116' is deposited on the gate insulating layer 126 having the TFT 119, the data line 118a' and the active pattern 117. A photoresist film 134 is coated on the deposited insulating material 116'. The photoresist film 134 may comprise a positive photoresist film, a negative photoresist film, etc. The coated photoresist film 134 is exposed through a mask 135 for the passivation layer. An ultraviolet light is irradiated onto the coated photoresist film 134 through a reticle 136 of the mask 135 for the passivation layer.

Figure 9:
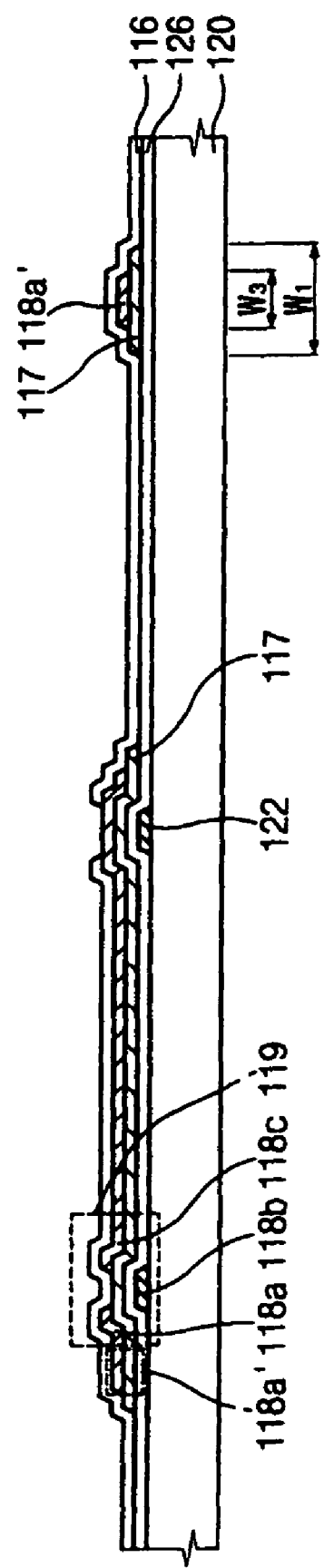

Referring to FIG. 9, the exposed photoresist film 134 is developed. The deposited insulating material 116' is partially etched to form the passivation layer 116 having the contact hole through which the drain electrode 118c is partially exposed. The remaining photoresist film on the passivation layer 116 is then stripped.

Figure 10:
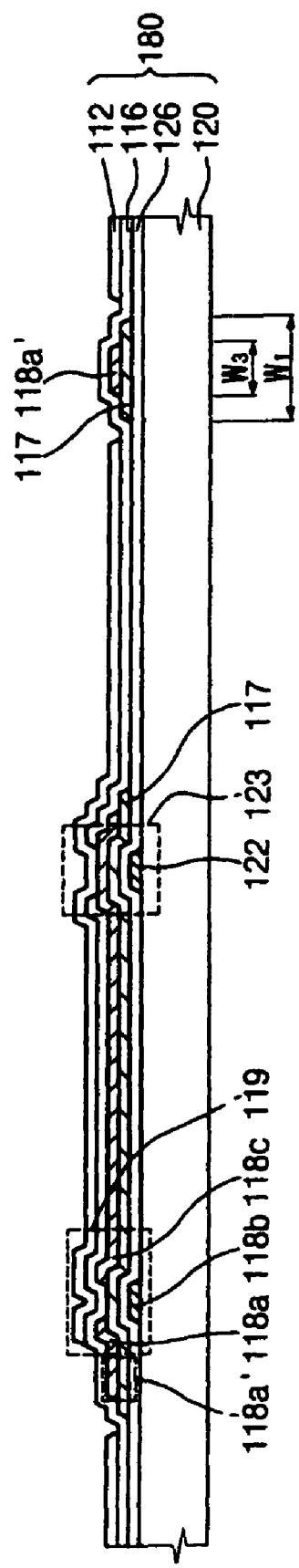

Referring to FIG. 10, the transparent conductive material is deposited on the passivation layer 116 and the inner surface of the contact hole. The deposited transparent conductive material is partially etched to form the pixel electrode 112. Therefore, the second substrate 180 having the lower substrate 120, the TFT 119, the gate line 118b', the data line 118a', the storage capacitor 123, the storage capacitor line 122, the gate insulating layer 126, the active pattern 117, the passivation layer 116 and the pixel electrode 112 is completed.

Figure 11:
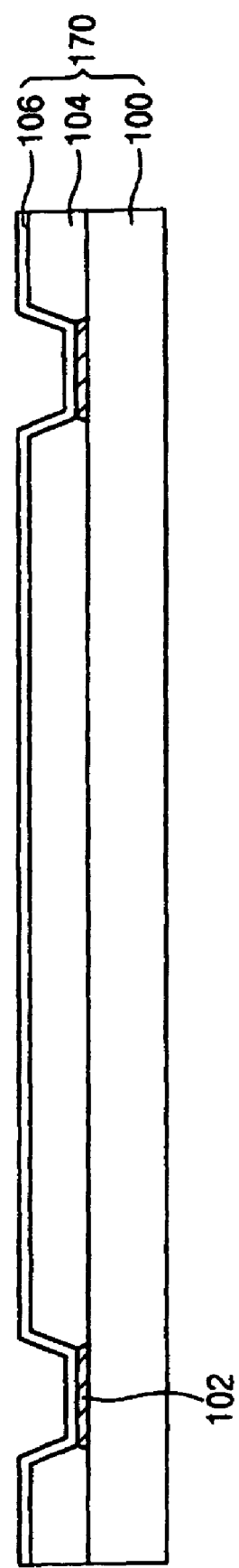

Referring to FIG. 11, the opaque material is deposited on the upper substrate 100. The deposited opaque material is partially removed to form the black matrix 102. Alternatively, a photoresist film containing an opaque organic material is coated on the upper substrate 100, and the coated photoresist film containing the opaque organic material is then partially removed to form the black matrix 102. Alternatively, the black matrix 102 may be formed on the lower substrate 120.

The color filter 105 is formed on the upper substrate 100 having the black matrix 102. Alternatively, an overcoating layer (not shown) may be formed on the upper substrate 100 having the black matrix 102 and the color filter 105.

The transparent conductive material is deposited on the upper substrate 100 having the black matrix 102 and the color filter 105 to form the common electrode 106.

Therefore, the first substrate 170 having the upper substrate 100, the black matrix 102, the color filter 105 and the common electrode 106 is completed.

Figure 12:
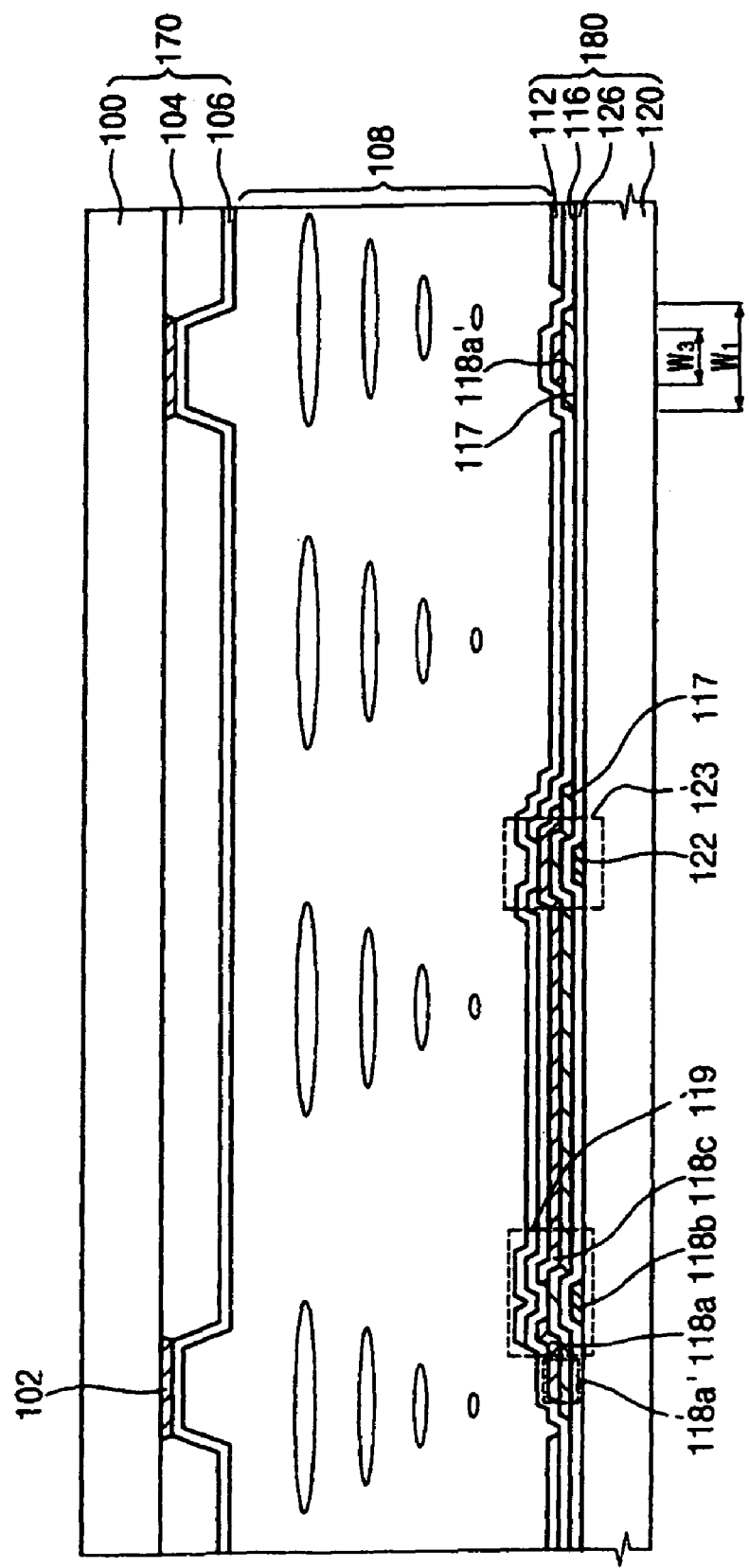

Referring to FIG. 12, the first substrate 170 is positioned to face the second substrate 180, and the liquid crystal is injected into a space between the first and second substrates 170 and 180. The liquid crystal is sealed between the first and second substrates 170 and 180 by the sealant (not shown) to form the liquid crystal layer 108. Alternatively, the liquid crystal is deposited on the first or second substrate 170 or 180 having the sealant (not shown), and the first substrate 170 is combined with the second substrate 180 to form the liquid crystal layer 108.

According to the LCD device of FIGS. 1 to 12, the data line 118a', the source electrode 118a, the drain electrode 118c and the active pattern 117 are formed using a single mask so that the manufacturing process of the LCD device is simplified. However, when the data line 118a' comprises chromium, the electrical resistance of the data line 118a' may be increased. Therefore, the width of the data line 118a' is increased so that an opening rate of the LCD device may be decreased.

An LCD device was manufactured to test skews of a data line and an active pattern. The skew is the difference between the width of the photoresist pattern and the width of the data line or the active pattern caused by the etching process The LCD device of this example is substantially the same as in FIGS. 1 to 12. Thus, the same reference numerals will be used to refer to the same or like parts as those described in FIGS. 1 to 12 and any further explanation concerning the above elements will be omitted.

Referring to FIG. 3, a gate electrode 118b, a gate line 118b', a storage capacitor line 122 and a gate insulating layer 126 were formed on a lower substrate 120. Thicknesses of the gate electrode 118b, the gate line 118b', the storage capacitor line 122 and the gate insulating layer 126 were 3,000 Å, 3,000 Å, 3,000 Å and 4,000 Å, respectively.

Referring to FIG. 4, an active layer 117' and a chromium layer 118c''' were formed on the gate insulating layer 126. Thicknesses of the active layer 117' and the chromium layer 118c''' were 3,000 Å and 2,000 Å, respectively.

Referring to FIGS. 2 and 5, photoresist patterns 131 were formed on the chromium layer 118c'''. A width $W_{11}$ of the photoresist pattern 131 corresponding to the data line 118a' was 7 μm.

Referring to FIG. 6, the active layer 117' and the chromium layer 118c''' having the photoresist patterns 131 were partially etched to form a primary active layer 117", a primary data line 118a" and a primary source/drain electrode 118c". A width $W_2$ of the primary data line 118a" was 5.5 μm, and a width $W_{12}$ of the primary active layer 117" under the primary data line 118a" was 6.8 μm.

Referring to FIG. 7, the primary source/drain electrode 118c" corresponding to the gate electrode 118b was partially etched to form a source electrode 118a and a drain electrode 118c.

Sides of the primary data line 118a" and the primary active layer 117" were etched to form the data line 118a' and the active pattern 117 while the primary source/drain electrode 118c" was partially etched. A width $W_3$ of the data line 118a' and a width $W_1$ of the active pattern 117 under the data line 118a' were 4 μm and 6.7 μm, respectively.

Referring to FIGS. 8 to 10, a passivation layer 116 having a contact hole and a pixel electrode 112 were formed on the gate insulating layer 126 having the TFT 119, the data line 118a' and the active pattern 117. A distance between the pixel electrode 112 and the active pattern 117 was 3.3 μm, and a distance between the pixel electrode 112 and the data line 118a' was 4.8 μm.

Referring to FIGS. 11 and 12, a first substrate 170 was then formed, and a liquid crystal was injected into a space between the first and second substrates 170 and 180 to form a liquid crystal layer 108 that was sealed by a sealant (not shown).

In FIGS. 3 to 12, a skew of the data line 118a' was 3 μm, and a skew of the active pattern 117 was 0.3 μm. The skew of the data line 118a' was substantially equal to the difference between the width $W_{11}$ of the photoresist pattern 131 and the width $W_3$ of the data line 118a'. The skew of the active pattern 117 was substantially equal to the difference between the width $W_{11}$ of the photoresist pattern 131 and the width $W_1$ of the active pattern 117. The skew of the data line 118a' was increased so that the width $W_3$ of the data line 118a' was decreased. In addition, a difference between the skews of the data line 118a' and the active pattern 117 was increased so that the width $W_3$ of the data line 118a' was decreased.

Figure 13:
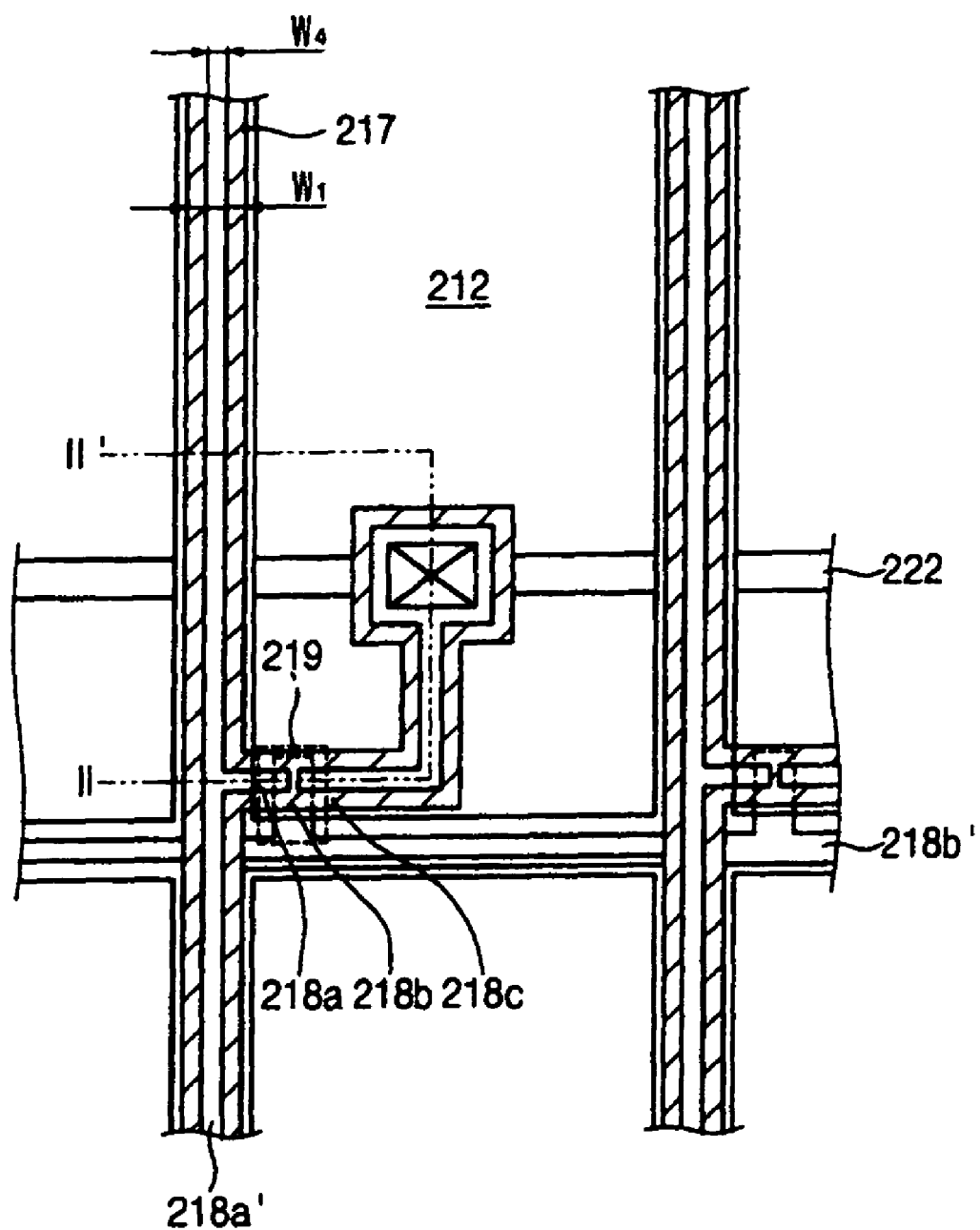
FIG. 13 is a plan view showing an LCD device in accordance with another embodiment of the present invention.
Figure 14:
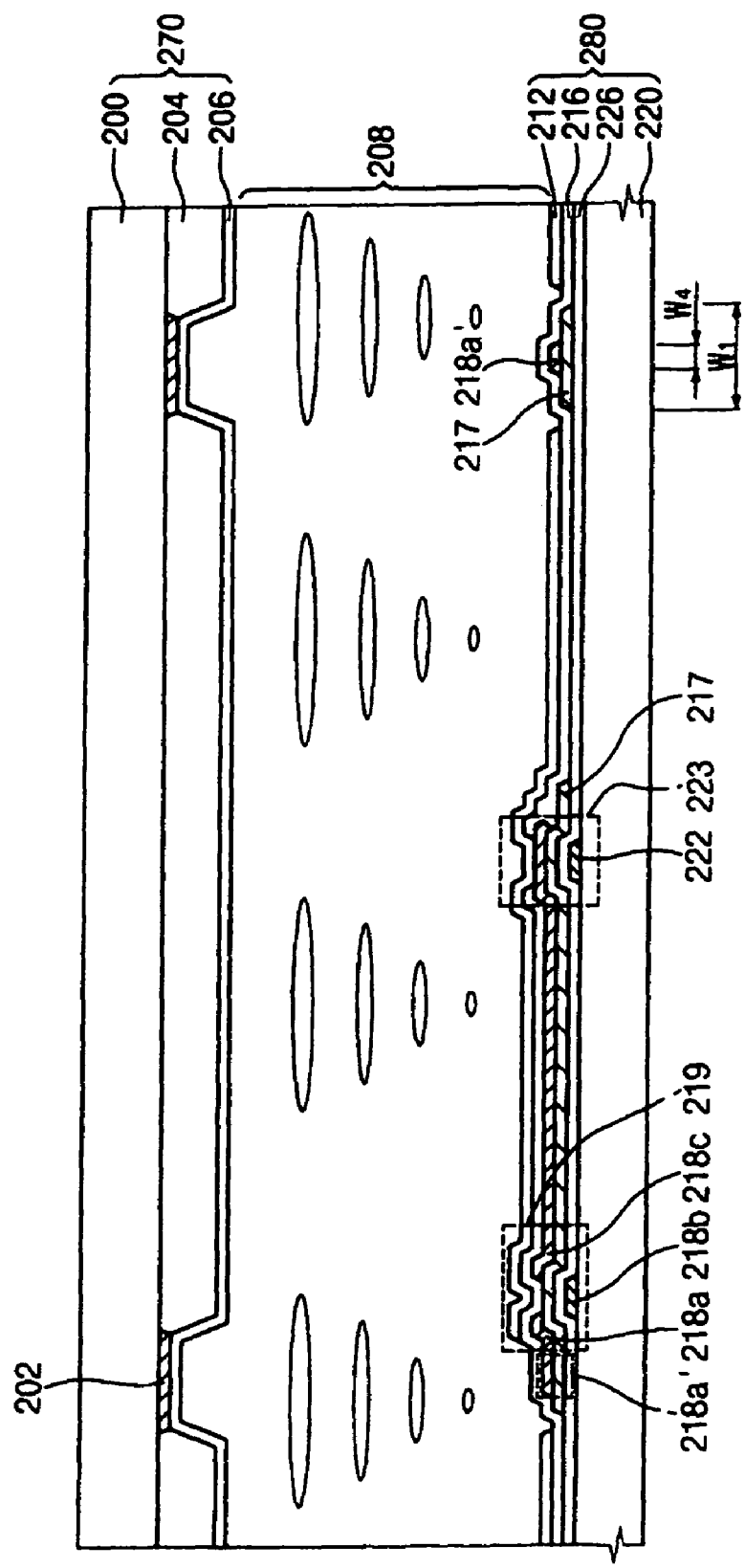
FIG. 14 is a cross-sectional view taken along a line II-II' shown in FIG. 13.

FIG. 13 is a plan view showing an LCD device in accordance with another embodiment of the present invention. FIG. 14 is a cross-sectional view taken along a line II-II' shown in FIG. 13. The LCD device of FIGS. 13 and 14 is substantially the same as in FIGS. 1 and 2 except for a data line, a source electrode and a drain electrode, as will be described in greater detail below. Thus, the same reference numerals will be used to refer to the same or like parts as those described in FIGS. 1 and 2 and any further explanation concerning the above elements will be omitted.

Referring to FIGS. 13 and 14, the LCD device includes a first substrate 270, a second substrate 280, a spacer (not shown) and a liquid crystal layer 208.

The first substrate 270 includes an upper substrate 200, a black matrix 202, a color filter 204 and a common electrode 206.

The second substrate 280 includes a lower substrate 220, a thin film transistor (TFT) 219, a gate line 218b', a data line 218a', a storage capacitor 223, a storage capacitor line 222, a gate insulating layer 226, an active pattern 217, a passivation layer 216 and a pixel electrode 212. The gate and data lines 218b' and 218a' define a pixel.

The TFT 219 is provided in the pixel region of the lower substrate 220, and includes a source electrode 218a, a gate electrode 218b, a drain electrode 218c and a semiconductor layer pattern. In the LCD device of FIGS. 13 and 14, each of the source electrode 218a, the drain electrode 218c and the data line 218a' comprises, e.g., a molybdenum (Mo) layer, molybdenum-aluminum (Mo—Al) alloy layer, etc. Alternatively, each of the source electrode 218a, the drain electrode 218c and the data line 218a' may comprise a multi-layered structure comprising at least one molybdenum layer and at least one aluminum layer. In the LCD device of FIGS. 13 and 14, each of the source electrode 218a, the drain electrode 218c and the data line 218a' has a triple layered structure of molybdenum/aluminum/molybdenum (Mo/Al/Mo).

The molybdenum has a lower electrical resistance than the chromium. In addition, the molybdenum has a lower etch resistance than the chromium. Therefore, when the source electrode 218a, the drain electrode 218c and the data line 218a' comprising molybdenum are etched through the method shown in FIGS. 5 to 7, the sides of the source electrode 218a, the drain electrode 218c and the data line 218a' are more etched than the sides of the source electrode, the drain electrode and the data line of FIGS. 5 to 7. As a result, the width $W_4$ of the data line 218a' in FIG. 13 is less than a width of the data line in FIG. 7.

The width $W_4$ of the data line 218a' is less than a width $W_3$ of the active pattern 217. The width $W_4$ of the data line 218a' comprising molybdenum is less than the width $W_3$ of the data line 118a' shown in FIG. 7 comprising chromium.

According to the LCD device of FIGS. 13 and 14, a unit resistance of the data line 218a' comprising molybdenum is less than a unit resistance of the data line of FIG. 7 comprising chromium. Thus, the data line 218a' in FIG. 13 may have a lower electrical resistance than the data line in FIG. 7. However, molybdenum has a lower etch resistance than chromium so that the width $W_4$ of the data line 218a' is less than the width $W_3$ of the data line 118a' shown in FIG. 7 when the data line 218a' is formed through the method shown in FIGS. 5 to 7.

An LCD device was manufactured to test skews of a data line and an active pattern. Each of the skews is a recessed amount of the data line and the active pattern caused by an etching process. The LCD device of this example is substantially the same as in FIGS. 13 to 14. Thus, the same reference numerals will be used to refer to the same or like parts as those described in FIGS. 13 to 14 and any further explanation concerning the above elements will be omitted.

Referring to FIGS. 13 and 14, a gate electrode 218b, a gate line 218b', a storage capacitor line 222 and a gate insulating layer 226 were formed on a lower substrate 220. Thicknesses of the gate electrode 218b, the gate line 218b', the storage capacitor line 222 and the gate insulating layer 226 were 3,000 Å, 3,000 Å, 3,000 Å and 4,000 Å, respectively.

An active layer and a molybdenum layer were formed on the gate insulating layer 226. Thicknesses of the active layer and the molybdenum layer were 3,000 Å and 2,000 Å, respectively.

A photoresist pattern was formed on the molybdenum layer. A width of the photoresist pattern corresponding to the data line 218a' was 7 μm.

The active layer and the molybdenum layer having the photoresist pattern were partially etched to form a primary active layer, a primary data line and a primary source/drain electrode. A width of the primary data line was 4.6 μm, and a width of the primary active layer under the primary data line was 6.8 μm.

The primary source/drain electrode corresponding to the gate electrode 218b was partially etched to form a source electrode 218a and a drain electrode 218c.

Sides of the primary data line and the primary active layer were etched to form the data line 218a' and the active pattern 217 while the primary source/drain electrode was partially etched. A width $W_4$ of the data line 218a' and a width $W_1$ of the active pattern 217 under the data line 218a' were 2.2 μm and 6.7 μm, respectively.

A passivation layer 216 having a contact hole and a pixel electrode 212 were formed on the gate insulating layer 226 having the TFT 219, the data line 218a' and the active pattern 217. A distance between the pixel electrode 212 and the active pattern 217 was 3.3 μm, and a distance between the pixel electrode 212 and the data line 218a' was 5.4 μm.

A first substrate 270 was then formed, and a liquid crystal was injected into a space between the first and second substrates 270 and 280 to form a liquid crystal layer 208 that was sealed by a sealant (not shown).

In FIGS. 13 and 14, a skew of the data line 218a' was 4.8 μm, and a skew of the active pattern 217 was 0.3 μm. A resistivity of molybdenum is $5 \times 10^{-8}$ Ωm, and a resistivity of chromium is $12.7 \times 10^{-8}$ Ωm. In addition, the width $W_3$ of the data line 218a' comprising molybdenum was 4 μm, and a width of the data line of FIG. 7 comprising chromium was 2.2 μm. An electrical resistance of the data line 218a' comprising molybdenum was 0.9 times the electrical resistance of the data line 118a' of FIG. 7 comprising chromium. Therefore, the electrical resistance of the data line 218a' comprising molybdenum was lowered, even though the width $W_3$ of the data line 218a' was decreased.

Figure 15:
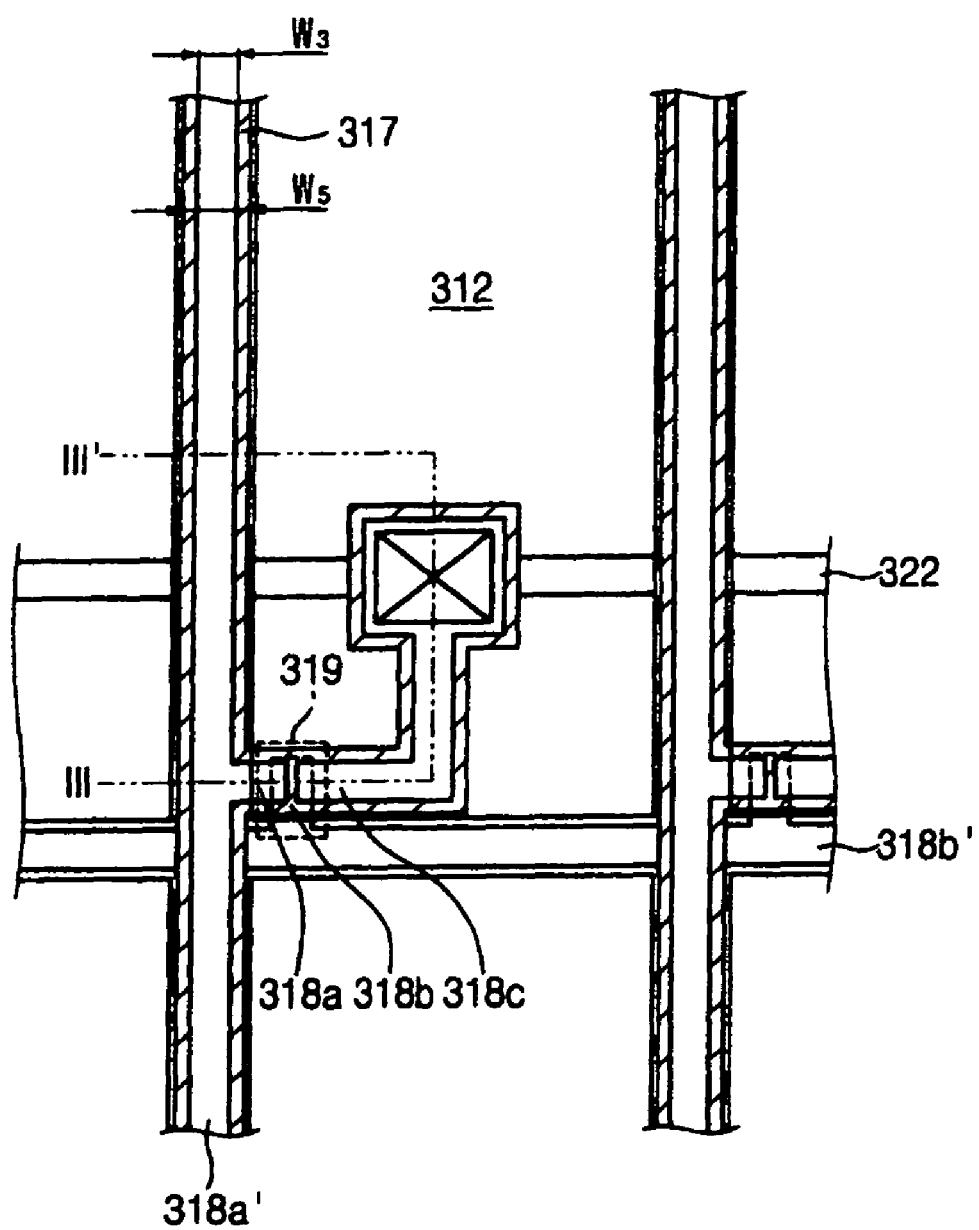
FIG. 15 is a plan view showing an LCD device in accordance with another embodiment of the present invention.
Figure 16:
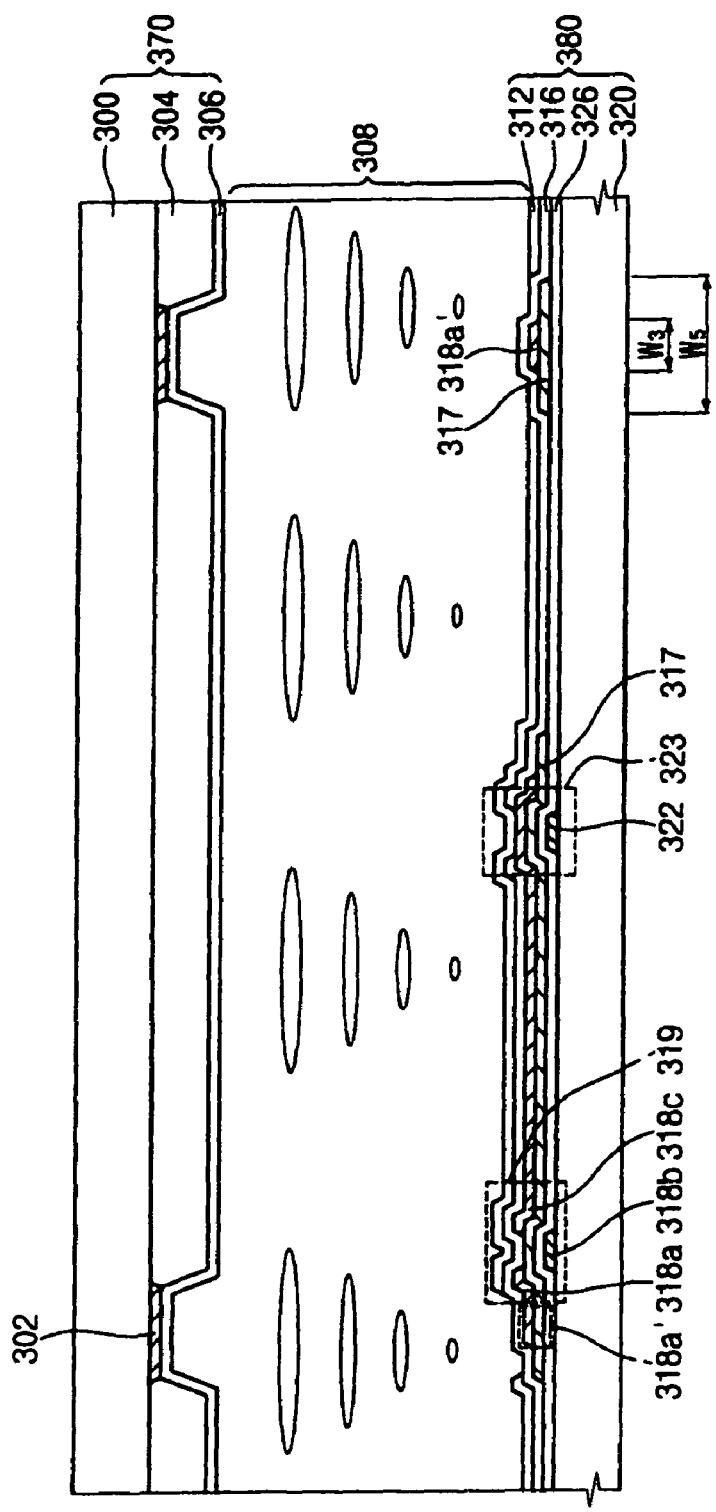
FIG. 16 is a cross-sectional view taken along a line III-III' shown in FIG. 15.

FIG. 15 is a plan view showing an LCD device in accordance with another embodiment of the present invention. FIG. 16 is a cross-sectional view taken along a line III-III' shown in FIG. 15. The LCD device of FIGS. 15 and 16 is substantially the same as in FIGS. 1 to 2, except for a data line, a source electrode, a drain electrode and an active pattern, as will be described in greater detail below. Thus, the same reference numerals will be used to refer to the same or like parts as those described in FIGS. 1 to 2 and any further explanation concerning the above elements will be omitted.

Referring to FIGS. 15 and 16, the LCD device includes a first substrate 370, a second substrate 380, a spacer (not shown) and a liquid crystal layer 308.

The first substrate 370 includes an upper substrate 300, a black matrix 302, a color filter 304 and a common electrode 306.

The second substrate 380 includes a lower substrate 320, a thin film transistor (TFT) 319, a gate line 318b', a data line 318a', a storage capacitor 323, a storage capacitor line 322, a gate insulating layer 326, an active pattern 317, a passivation layer 316 and a pixel electrode 312. The gate and data lines 318b' and 318a' define a pixel.

The TFT 319 is provided in the pixel region of the lower substrate 320, and includes a source electrode 318a, a gate electrode 318b, a drain electrode 318c and a semiconductor layer pattern. In the LCD device of FIGS. 15 and 16, each of the source electrode 318a, the drain electrode 318c and the data line 318a' comprises, e.g., a molybdenum (Mo) layer, molybdenum-aluminum (Mo—Al) alloy layer, etc. These materials can be used alone or in combination. Alternatively, each of the source electrode 318a, the drain electrode 318c and the data line 318a' may comprise a multi-layered structure comprising at least one molybdenum layer and at least one aluminum layer. In the LCD device of FIGS. 15 and 16, each of the source electrode 318a, the drain electrode 318c and the data line 318a' has a triple layered structure of molybdenum/aluminum/molybdenum (Mo/Al/Mo).

Referring to FIGS. 2 and 16, the molybdenum has a lower electrical resistance than the chromium. In addition, the molybdenum has a lower etch resistance than the chromium so that a difference between skews of the data line 318a' comprising molybdenum and the active pattern 317 is greater than a difference between skews of the data line 118a' of FIGS. 1 and 2 comprising chromium and the active pattern 117 of FIGS. 1 and 2. Therefore, when a width $W_3$ of the data line 318a' comprising molybdenum is substantially equal to a width of the data line 118a' of FIGS. 1 and 2 comprising chromium, a width $W_5$ of the active pattern 317 under the data line 318a' is greater than a width of the active pattern of FIGS. 1 and 2.

According to the LCD device of FIGS. 15 and 16, a unit resistance of the data line 318a' comprising molybdenum is lower than a unit resistance of the data line of FIGS. 1 and 2 comprising chromium. Therefore, when the data line 318a' comprising molybdenum has a substantially same width as the data line of FIGS. 1 and 2 comprising chromium, the data line 318a' has a lower electrical resistance than the data line of FIGS. 1 and 2. However, when the width $W_5$ of the active pattern 317 is increased, a distance between the pixel electrode 312 and the active pattern 317 is decreased so that an electromagnetic interference may result between the pixel electrode 312 and the active pattern 317.

An LCD device was manufactured to test skews of a data line and an active pattern. Each of the skews is a recessed amount of the data line and the active pattern formed by an etching process. The LCD device of this example is substantially the same as in FIGS. 15 to 16. Thus, the same reference numerals will be used to refer to the same or like parts as those described in FIGS. 15 to 16 and any further explanation concerning the above elements will be omitted.

Referring to FIGS. 15 and 16, a gate electrode 318b, a gate line 318b', a storage capacitor line 322 and a gate insulating layer 326 were formed on a lower substrate 320.

An active layer and a molybdenum layer were formed on the gate insulating layer 326.

Photoresist patterns were formed on the molybdenum layer. A width of the photoresist pattern corresponding to the data line 318a' was 8.8 μm.

The active layer and the molybdenum layer having the photoresist pattern formed thereon were partially etched to form a primary active layer, a primary data line and a primary source/drain electrode. A width of the primary data line was 6.4 μm, and a width of the primary active layer under the primary data line was 8.6 μm.

The primary source/drain electrode corresponding to the gate electrode 318b was partially etched to form a source electrode 318a and a drain electrode 318c.

Sides of the primary data line and the primary active layer were etched to form the data line 318a' and the active pattern 317 while the primary source/drain electrode was partially etched. A width $W_3$ of the data line 318a' and a width $W_5$ of the active pattern 317 under the data line 318a' were 4 μm and 8.5 μm, respectively.

A passivation layer 316 having a contact hole and a pixel electrode 312 were formed on the gate insulating layer 326 having the TFT 319, the data line 318a' and the active pattern 317. A distance between the pixel electrode 312 and the active pattern 317 was 2.1 μm, and a distance between the pixel electrode 312 and the data line 318a' was 4.8 μm.

A first substrate 370 was then formed, and a liquid crystal was injected into a space between the first and second substrates 370 and 380 to form a liquid crystal layer 308 that was sealed by a sealant (not shown).

In FIGS. 15 and 16, a skew of the data line 318a' was 4.8 μm, and a skew of the active pattern 317 was 0.3 μm. A resistivity of molybdenum is $5\times10^{-8}$ Ωm, and a resistivity of chromium is $12.7\times10^{-8}$ Ωm. In addition, the width $W_3$ of the data line 318a' comprising molybdenum was 4 μm, and a width of the data line of FIGS. 1 and 2 comprising chromium was also 4 μm. An electrical resistance of the data line 318a' comprising molybdenum was 0.4 times the electrical resistance of the data line 118a' of FIGS. 1 and 2 comprising chromium. Therefore, the electrical resistance of the data line 318a' comprising molybdenum was lowered. A distance between the pixel electrode 312 and the active pattern 317 was 2.1 μm.

Figure 17:
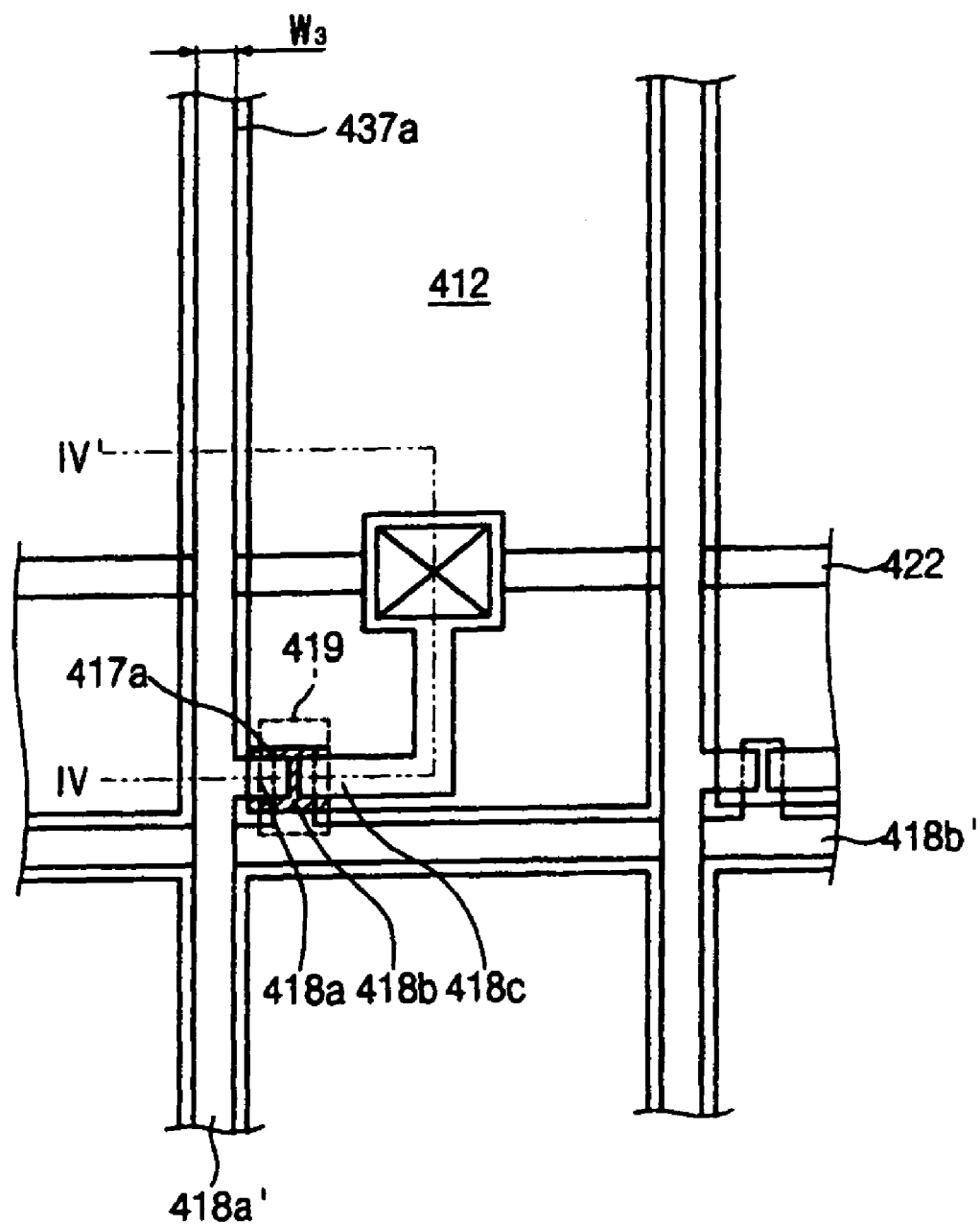
FIG. 17 is a plan view showing an LCD device in accordance with another embodiment of the present invention.
Figure 18:
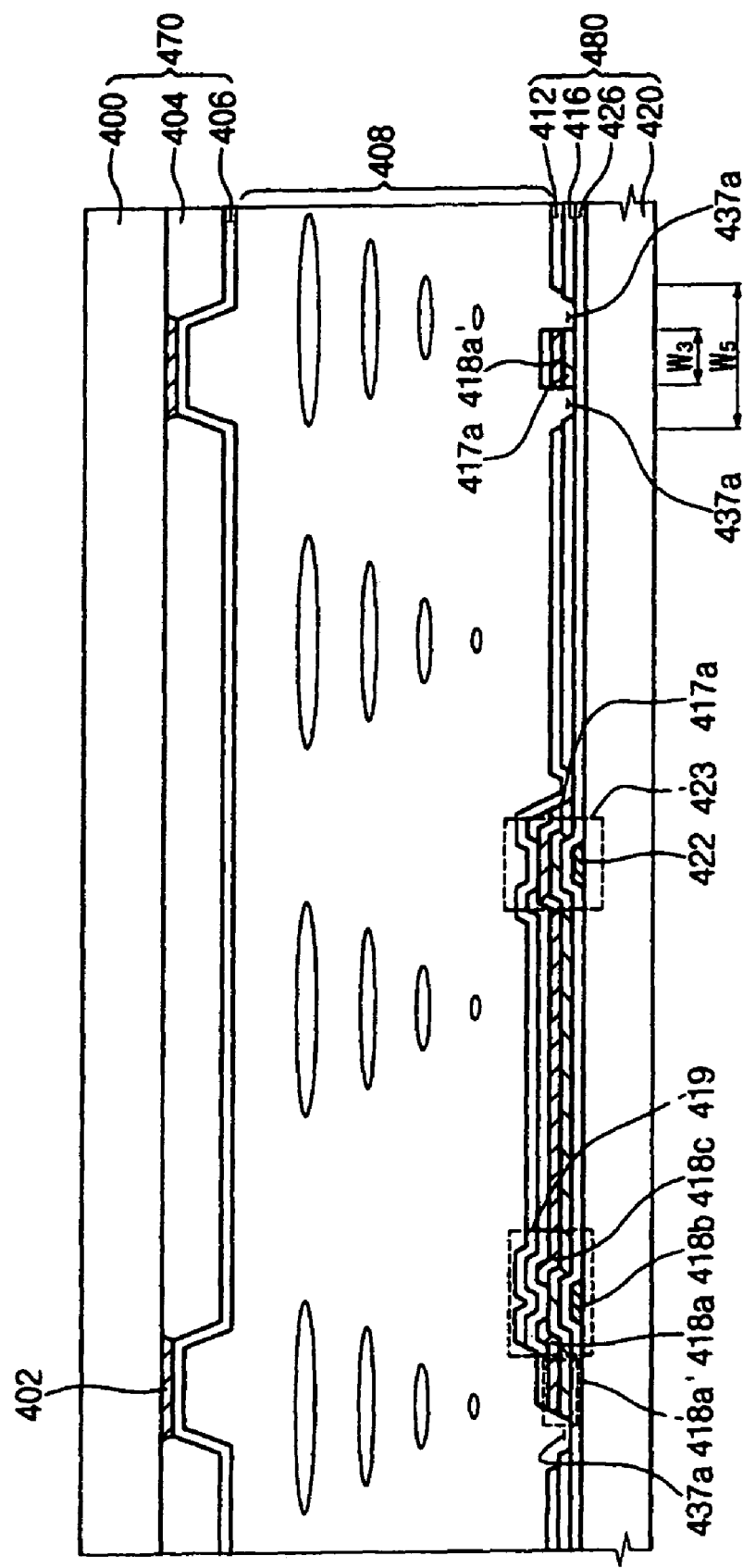
FIG. 18 is a cross-sectional view taken along a line IV-IV' shown in FIG. 17.

FIG. 17 is a plan view showing an LCD device in accordance with another embodiment of the present invention. FIG. 18 is a cross-sectional view taken along a line IV-IV' shown in FIG. 17. The LCD device of FIGS. 15 and 16 is substantially the same as in FIGS. 1 to 2 except for a data line, a source electrode, a drain electrode, an active pattern and a passivation layer, as will be described in greater detail below. Thus, the same reference numerals will be used to refer to the same or like parts as those described in FIGS. 1 to 2 and any further explanation concerning the above elements will be omitted.

Referring to FIGS. 17 and 18, the LCD device includes a first substrate 470, a second substrate 480, a spacer (not shown) and a liquid crystal layer 408.

The first substrate 470 includes an upper substrate 400, a black matrix 402, a color filter 404 and a common electrode 406.

The second substrate 480 includes a lower substrate 420, a thin film transistor (TFT) 419, a gate line 418b', a data line 418a', a storage capacitor 423, a storage capacitor line 422, a gate insulating layer 426, an active pattern 417a, a passivation layer 416 and a pixel electrode 412. The gate and data lines 418b' and 418a' define a pixel.

The TFT 419 is provided in the pixel region of the lower substrate 420, and includes a source electrode 418a, a gate electrode 418b, a drain electrode 418c and a semiconductor layer pattern. In the LCD device of FIGS. 17 and 18, each of the source electrode 418a, the drain electrode 418c and the data line 418a' comprises, e.g., a molybdenum (Mo) layer, molybdenum-aluminum (Mo—Al) alloy layer, etc. These materials can be used alone or in combination. Alternatively, each of the source electrode 418a, the drain electrode 418c and the data line 418a' may comprise a multi-layered structure comprising at least one molybdenum layer and at least one aluminum layer. In the LCD device of FIGS. 17 and 18, each of the source electrode 418a, the drain electrode 418c and the data line 418a' has a triple layered structure of molybdenum/aluminum/molybdenum (Mo/Al/Mo).

The active pattern 417a is formed on the gate insulating layer 426, and comprises an amorphous silicon layer and an N+ amorphous silicon layer on the amorphous silicon layer. In the LCD device of FIGS. 17 and 18, the active pattern 417a has substantially the same width $W_3$ as the data line 118a' of FIGS. 1 and 2. The source electrode 418a, the drain electrode 418c and the data line 418a' are on the active pattern 417a.

The passivation layer 416 is formed on the gate insulating layer 426 having the TFT 419, the active pattern 417a and the data line 418a', and has a contact hole and a groove 437a. In the LCD device of FIGS. 17 and 18, the passivation layer 416 has a plurality of grooves 437a. The drain electrode 418c is partially exposed through the contact hole, and the gate insulating layer 426 adjacent to the data line 418a' is exposed through the groove 437a. The pixel electrode 412 is spaced apart from the active patterns 417a to decrease an electromagnetic interference between the pixel electrode 412 and the data line 418a' on the active pattern 417a.

FIGS. 19 to 26 are cross-sectional views showing a method of manufacturing the LCD device shown in FIG. 17.

Figure 19:
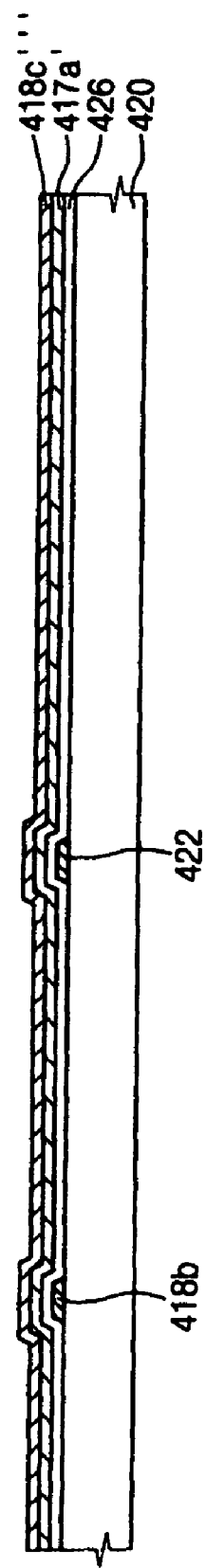
FIGS. 19 to 26 are cross-sectional views showing a method of manufacturing the LCD device shown in FIG. 17.

Referring to FIGS. 17 and 19, the gate electrode 418b, the gate line 418b' and the storage capacitor line 422 are formed on the lower substrate 420. The gate insulating layer 426 is deposited on the lower substrate 420 having the gate electrode 418b, the gate line 418b' and the storage capacitor line 422.

An amorphous silicon layer is deposited on the gate insulating layer 426. N+ ions are implanted on the deposited amorphous silicon to form the active layer 417a' comprising the amorphous silicon layer and the N+ amorphous silicon layer on the amorphous silicon layer. Molybdenum is deposited on the active layer 417a' to form the molybdenum layer 418c'''.

Figure 20:
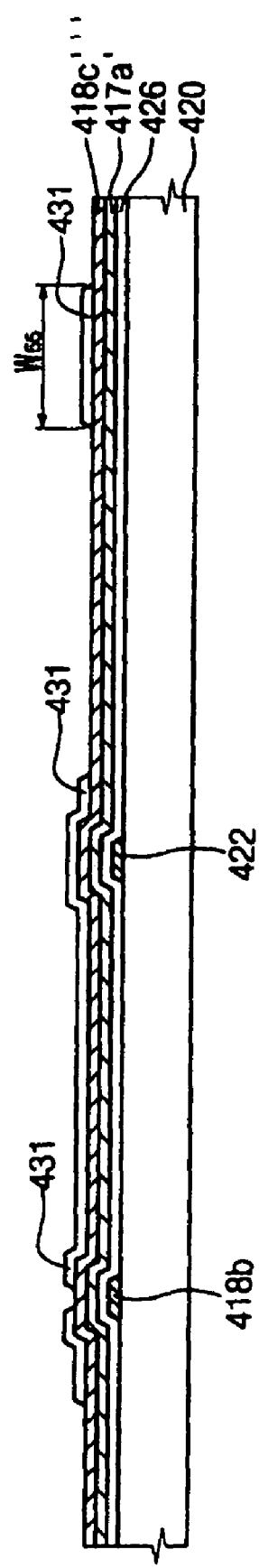

Referring to FIGS. 18 and 20, a photoresist film is coated on the molybdenum layer 418c'''. The coated photoresist film is exposed through a mask, and developed to form photoresist patterns 431 on the molybdenum layer 418c'''. In FIGS. 18 and 20, a width $W_{55}$ of the photoresist pattern corresponding to the data line 418a' is substantially the equal to a distance between adjacent pixel electrodes 412. Alternatively, the width $W_{55}$ of the photoresist pattern corresponding to the data line 418a' may be greater than the distance between the adjacent pixel electrodes 412. In yet other embodiments, the width $W_{55}$ of the photoresist pattern corresponding to the data line 418a' may be less than the distance between the adjacent pixel electrodes 412. The photoresist patterns 431 correspond to the source electrode 418a, the drain electrode 418c and the data line 418a'.

Figure 21:
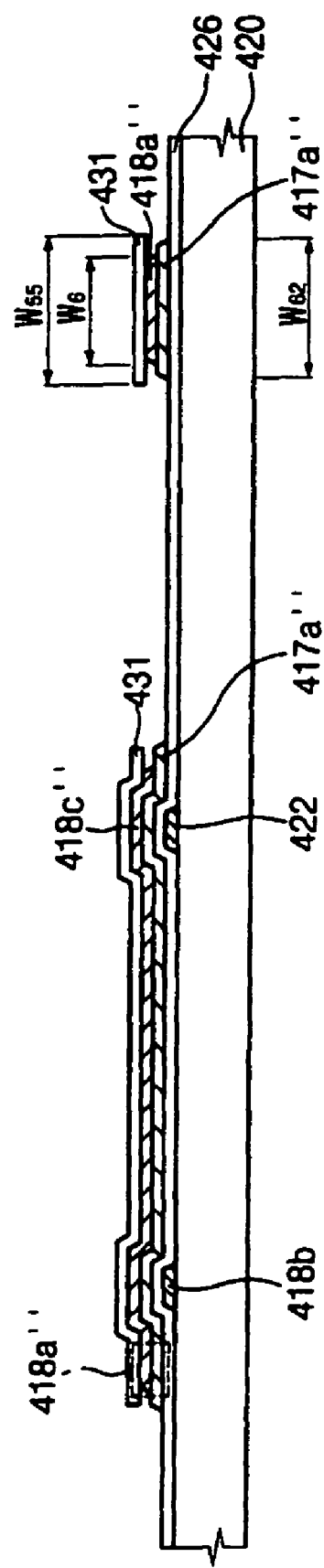

Referring to FIG. 21, the active layer 417' and the molybdenum layer 418c''' are partially etched using the photoresist patterns 431 as an etching mask to form a primitive active layer 417'', a primary data line 418a'' and a primary source/drain electrode 418c'' under the photoresist patterns 431. The active layer 417' and the molybdenum layer 418c''' are vulnerable to an etchant of the etching process so that a portion of the primary data line 418a'' and the primary active layer 417'' are recessed with respect to the photoresist patterns 431. Therefore, a width $W_6$ of the primary data line 418a'' and a width $W_{62}$ of the active layer 417'' are less than a width $W_{55}$ of the photoresist patterns 431. In FIG. 21, the width $W_{55}$ of the photoresist pattern 431 is substantially equal to the distance between the adjacent pixel electrodes 412. Alternatively, the width $W_{55}$ of the photoresist pattern 431 may be greater than the distance between the adjacent pixel electrodes 412. The width $W_{62}$ of the primary active layer 417a'' that is under the primary data line 418a'' is greater than the width $W_6$ of the primary data line 418a''.

Figure 22:
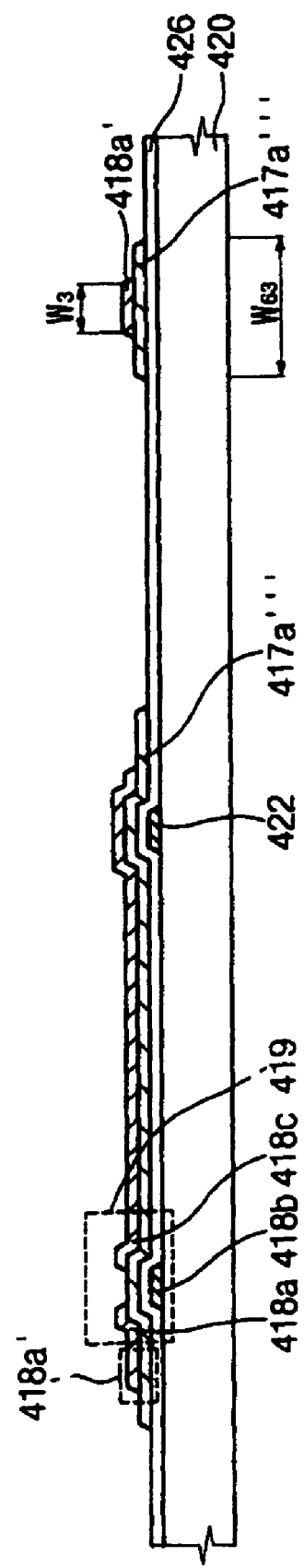

Referring to FIG. 22, the photoresist patterns 431 on the primary data line 418a'' and the primary source/drain electrode 418c'' are removed. The primary source/drain electrode 418c'' corresponding to the gate electrode 418b is etched to form the source electrode 418a and the drain electrode 418c.

Sides of the primary data line 418a'' and the primary active layer 417'' are etched to form the data line 418a' and the primary active pattern 417a''' while the primary source/drain electrode 418c'' is partially etched. The width $W_3$ of the data line 418a' is less than the width $W_6$ of the primary data line 418a''. The width $W_{63}$ of the primary active pattern 417a''' that is under the data line 418a' is less than a width $W_{62}$ of the primary active layer 417a''. The N+ amorphous silicon layer of the primary active pattern 417a''' between the source electrode 418a and the drain electrode 418c is then partially removed. The N+ amorphous silicon layer between the source electrode 418a and the drain electrode 418c may be etched with the etching process of the primary source/drain electrode 418c''.

Figure 23:
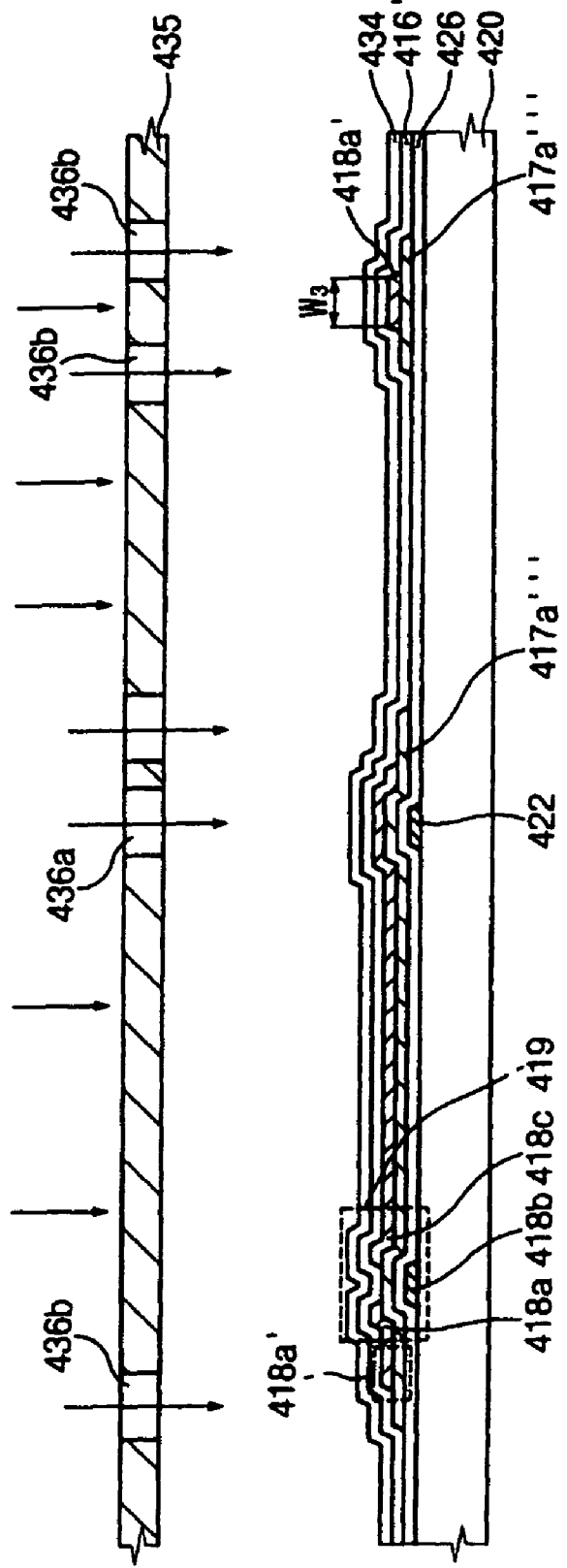

Referring to FIG. 23, a transparent insulating material 416' is deposited on the gate insulating layer 426 having the TFT 419, the data line 418a' and the primary active pattern 417a'''. A photoresist film 434 is coated on the deposited insulating material 416'. The photoresist film 434 may comprise a positive photoresist film, a negative photoresist film, etc. The coated photoresist film 434 is exposed through a mask 435 for the passivation layer. An ultraviolet light is irradiated onto the coated photoresist film 434 through the mask 435 for the passivation layer. The mask 435 for the passivation layer includes a first reticle 436a and a second reticle 436b.

In FIG. 23, the ultraviolet light is irradiated onto a portion of the coated photoresist film corresponding to the drain electrode 418c through the first reticle 436a of the mask 435 for the passivation layer. In addition, the ultraviolet light is irradiated onto the coated photoresist film adjacent to the data line 418a' through the second reticles 436b. Each of the second reticles 436b may comprise a slit. In FIG. 23, a side of the second reticle 436b corresponds to a side of the data line 418a'.

Figure 24:
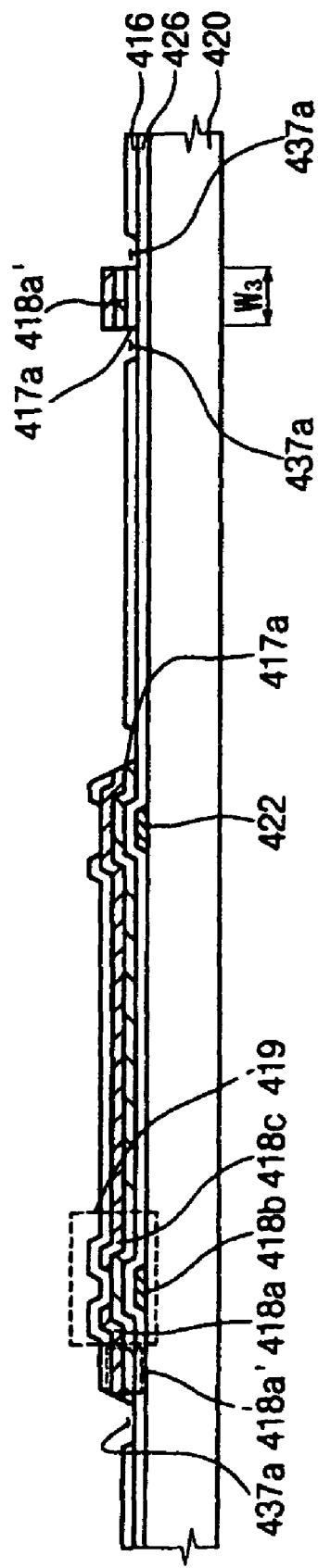

Referring to FIG. 24, the exposed photoresist film 434 is developed. The deposited insulating material 416' is partially etched to form the passivation layer 416 having the contact hole and the grooves 437a. The drain electrode 118c is partially exposed through the contact hole. The gate insulating layer 426 adjacent to the data line 418a' is exposed through the grooves 437a. Alternatively, the lower substrate 420 adjacent to the data line 418a' may be exposed through the grooves 437a. A depth of each of the grooves 437a is determined by an etchant, an etching time, etc. An etch resistance of the metal is greater than an etch resistance of the insulating material and the amorphous silicon. In FIG. 24, the contact hole and the grooves 437a are formed through the same etching process. For example, the deposited insulating material 416' corresponding to the drain electrode 118c, the deposited insulating material adjacent to the data line 418a', and the primary active pattern 417a' adjacent to the data line 418a' are removed through the same process. The remaining photoresist pattern on the passivation layer 416 is then stripped.

Figure 25:
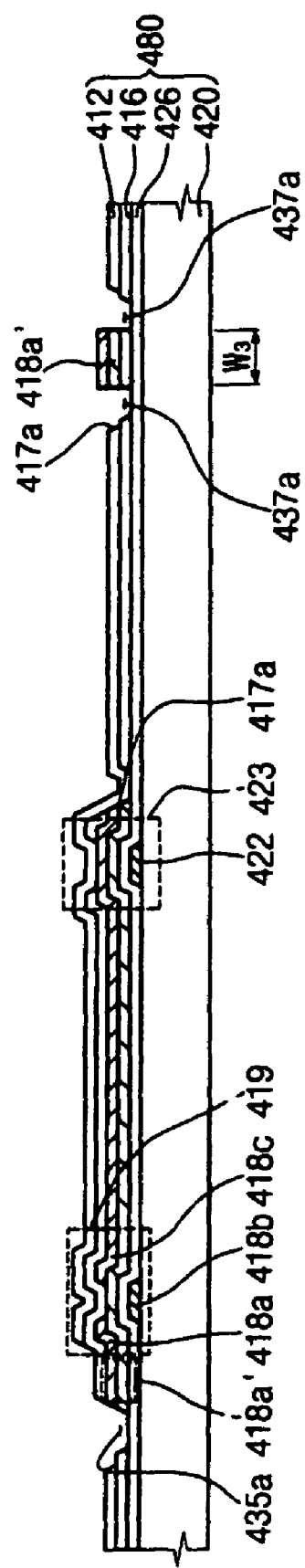

Referring to FIG. 25, the transparent conductive material is deposited on the passivation layer 416 and the inner surface of the contact hole. The deposited transparent conductive material is partially etched to form the pixel electrode 412. Therefore, the second substrate 480 having the lower substrate 420, the TFT 419, the gate line 418b', the data line 418a', the storage capacitor 423, the storage capacitor line 422, the gate insulating layer 426, the active pattern 417, the passivation layer 416 and the pixel electrode 412 is completed.

Figure 26:
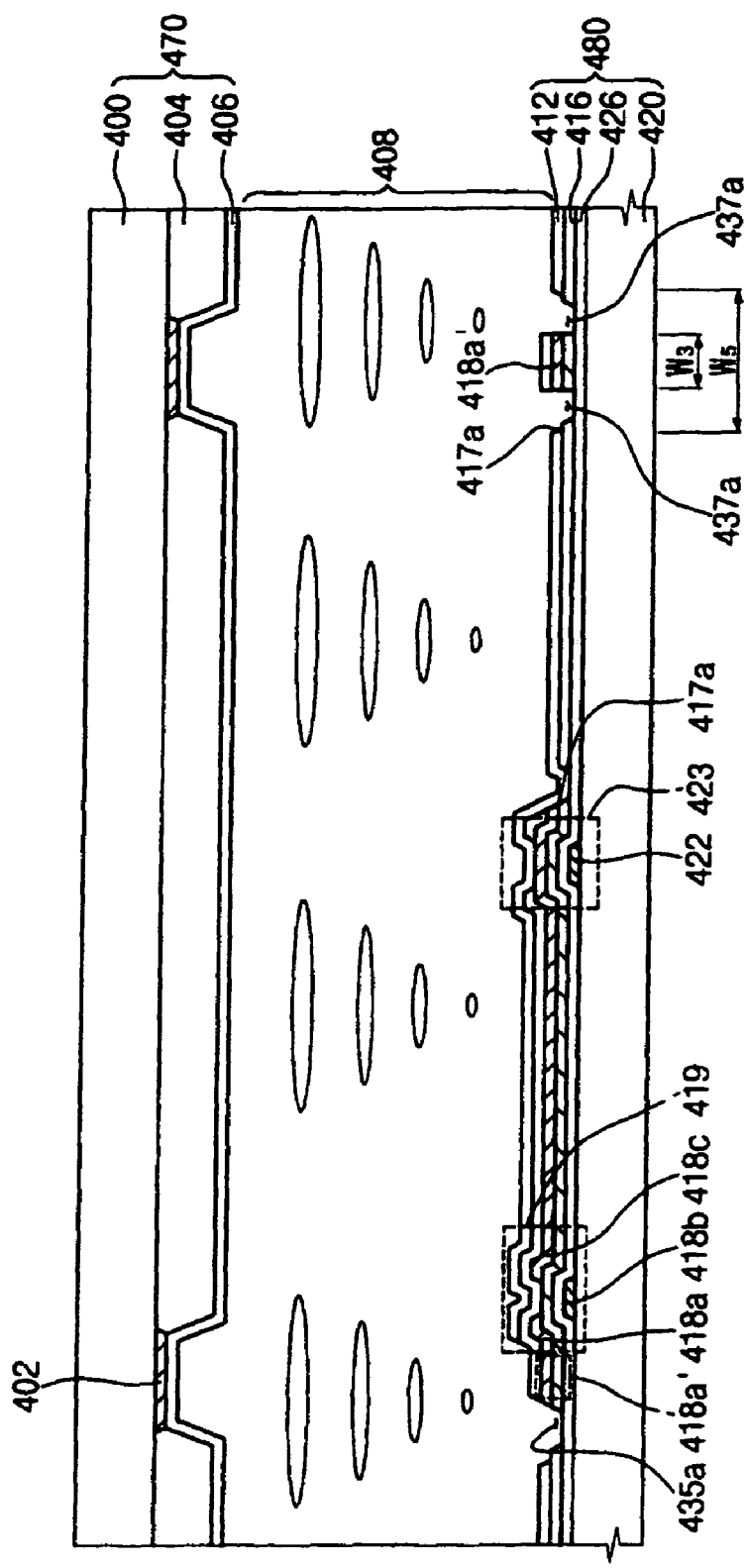

Referring to FIG. 26, the first substrate 470 having the upper substrate 400, the black matrix 402, the color filter 404 and the common electrode 406 is completed. The liquid crystal is injected into a space between the first and second substrates 470 and 480, and the liquid crystal is sealed by the sealant (not shown) to form the liquid crystal layer 408.

According to the LCD device of FIGS. 17 to 26, the data line 418a' comprises molybdenum to decrease an electrical resistance of the data line 418a'. In addition, the primitive active pattern 417a''' that is between the data line 418a' and the pixel electrode 412 is removed to decrease an electromagnetic interference between the pixel electrode 412 and the data line 418a' so that the width $W_3$ of the data line 418a' may be increased. Furthermore, the contact hole and the grooves 437a are formed through the same process so that a manufacturing process of the LCD device is simplified, and a manufacturing cost of the LCD device is decreased.

An LCD device was manufactured to test skews of a data line and an active pattern. Each of the skews is a recessed amount of the data line or the active pattern caused by an etching process. The LCD device of this example is substantially the same as in FIGS. 17 to 26. Thus, the same reference numerals will be used to refer to the same or like parts as those described in FIGS. 17 to 26 and any further explanation concerning the above elements will be omitted.

Referring to FIG. 19, the gate electrode 418b, the gate line 418b' and the storage capacitor line 422 were formed on the lower substrate 420. The gate insulating layer 426 was deposited on the lower substrate 420 having the gate electrode 418b, the gate line 418b' and the storage capacitor line 422. An active layer 417' and a molybdenum layer 418c''' were formed on the gate insulating layer 426.

Referring to FIGS. 18 and 20, photoresist patterns 431 were formed on the molybdenum layer 418c'''. A width $W_{55}$ of the photoresist pattern 431 corresponding to the data line 418a' was 8.8 μm.

Referring to FIG. 21, the active layer 417' and the molybdenum layer 418c''' were partially etched using the photoresist patterns 431 as an etching mask to form a primitive active layer 417", a primary data line 418a" and a primary source/drain electrode 418c" under the photoresist patterns 431. A width $W_6$ of the primary data line 418a" and a width $W_{62}$ of the active layer 417" were 6.4 μm and 8.6 μm, respectively.

Referring to FIG. 22, the primary source/drain electrode 418c" corresponding to the gate electrode 418b is partially etched to form the source electrode 418a and the drain electrode 418c.

Sides of the primary data line 418a" and the primary active layer 417" were etched to form the data line 418a' and the primary active pattern 417a''' while the primary source/drain electrode 418c" was partially etched. The width $W_3$ of the data line 418a' and the width $W_{63}$ of the primary active pattern 417a''' were 4 μm and 8.5 μm, respectively.

Referring to FIGS. 23 and 24, the passivation layer 416 having a contact hole and grooves 437a was formed on the gate insulating layer 426 having the TFT 419, the data line 418a' and the primary active pattern 417a'''. A width of the groove 437a was substantially equal to the difference between a skew of the primary active pattern 417a''' and a skew of the data line 418a' and was 2.3 μm.

Referring to FIG. 25, a pixel electrode 412 was formed on the passivation layer 416 and an inner surface of the contact hole. A distance between the pixel electrode 412 and the active pattern 417a was 4.5 μm, and a distance between the pixel electrode 412 and the data line 418a' was also 4.5 μm.

Referring to FIG. 26, the first substrate 470 having the upper substrate 400, the black matrix 402, the color filter 404 and the common electrode 406 was completed. The liquid crystal was injected into a space between the first and second substrates 470 and 480, and the liquid crystal was sealed by the sealant (not shown) to form the liquid crystal layer 408.

In FIGS. 19 to 26, skews of the data line 418a' and the primary active pattern 417a''' were 4.8 μm and 0.3 μm, respectively. The distance between the primary active pattern 417a''' and the pixel electrode 412 was 2.1 μm, and a width of the groove 437a was 2.3 μm. Thus, a distance between the active pattern 417a and the pixel electrode 412 was 4.4 μm.

Figure 27:
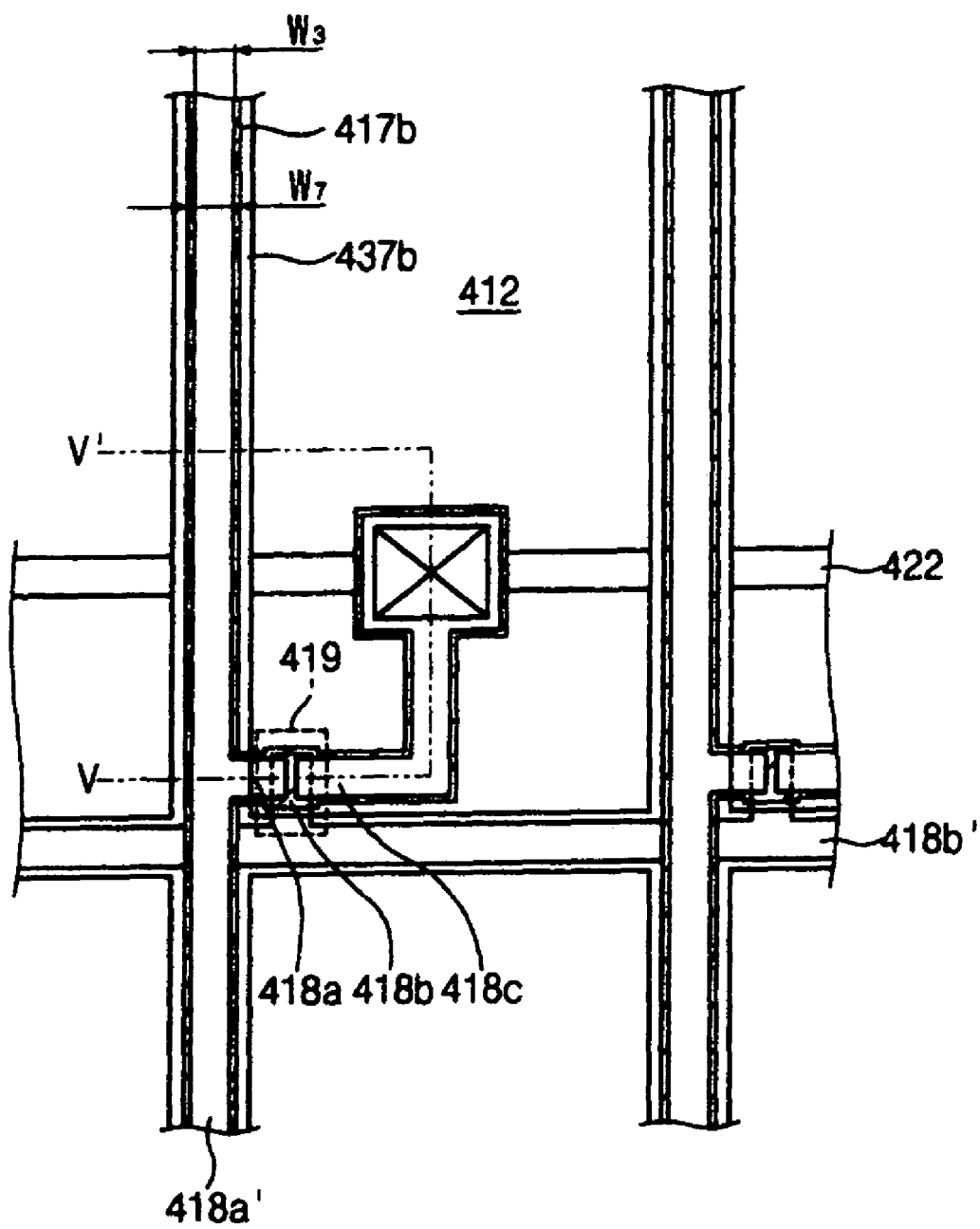
FIG. 27 is a plan view showing an LCD device in accordance with another embodiment of the present invention.
Figure 28:
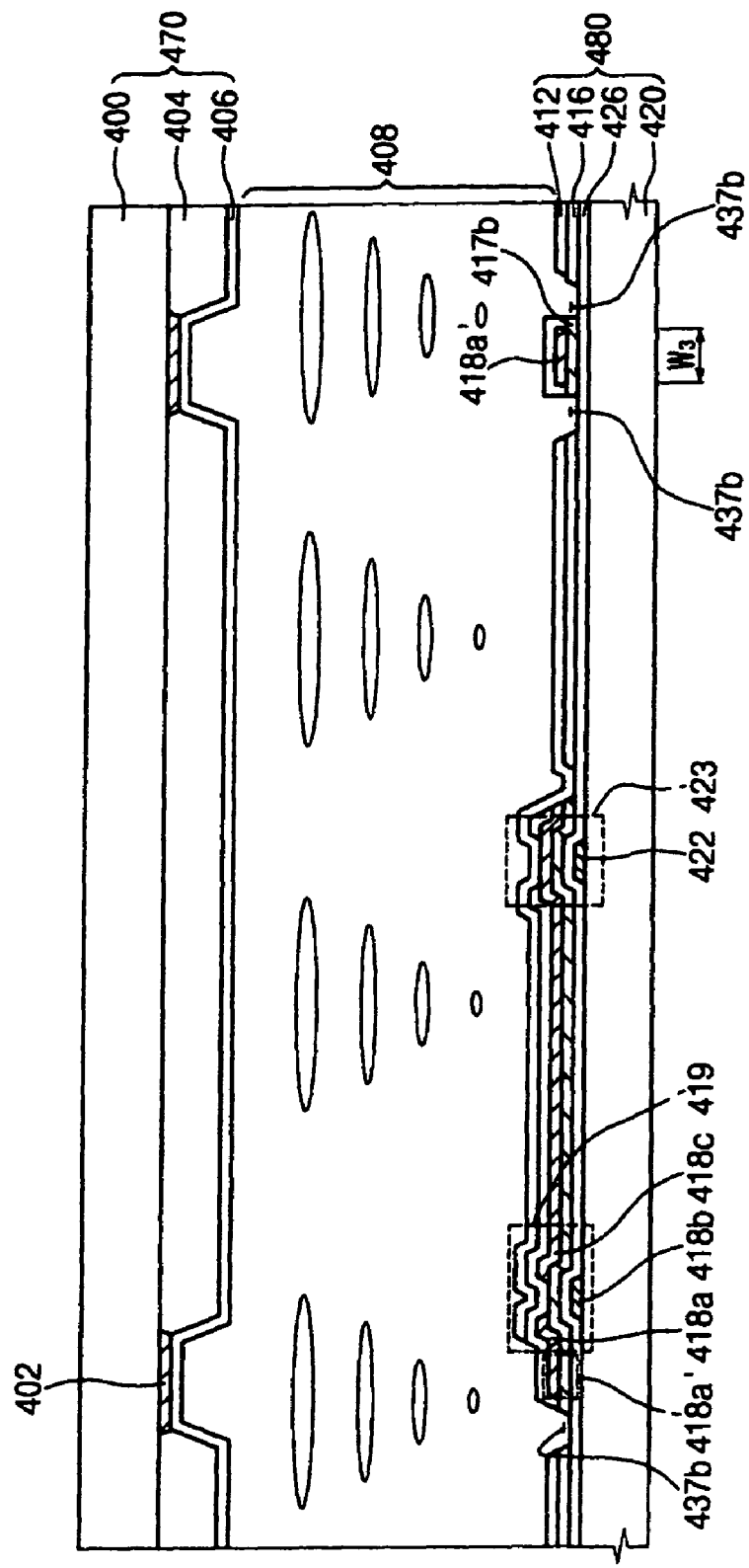
FIG. 28 is a cross-sectional view taken along a line V-V' shown in FIG. 27.

FIG. 27 is a plan view showing an LCD device in accordance with another embodiment of the present invention. FIG. 28 is a cross-sectional view taken along a line V-V' shown in FIG. 27. The LCD device of FIGS. 27 and 28 is substantially the same as in FIGS. 17 to 18 except for a groove, as will be described in greater detail below. Thus, the same reference numerals will be used to refer to the same or like parts as those described in FIGS. 17 to 18 and any further explanation concerning the above elements will be omitted.

Referring to FIGS. 27 and 28, the LCD device includes a first substrate 470, a second substrate 480, a spacer (not shown) and a liquid crystal layer 408.

The first substrate 470 includes an upper substrate 400, a black matrix 402, a color filter 404 and a common electrode 406.

The second substrate 480 includes a lower substrate 420, a thin film transistor (TFT) 419, a gate line 418b', a data line 418a', a storage capacitor 423, a storage capacitor line 422, a gate insulating layer 426, an active pattern 417b, a passivation layer 416 and a pixel electrode 412. The gate and data lines 418b' and 418a' define a pixel.

The TFT 419 is provided in the pixel region of the lower substrate 420, and includes a source electrode 418a, a gate electrode 418b, a drain electrode 418c and a semiconductor layer pattern. In the LCD device of FIGS. 27 and 28, each of the source electrode 418a, the drain electrode 418c and the data line 418a' comprises, e.g., a molybdenum (Mo) layer, molybdenum-aluminum (Mo—Al) alloy layer, etc. Alternatively, each of the source electrode 418a, the drain electrode 418c and the data line 418a' may comprise a multi-layered structure comprising at least one molybdenum layer and at least one aluminum layer.

The active pattern 417b is formed on the gate insulating layer 426, and comprises an amorphous silicon layer and an N+ amorphous silicon layer on the amorphous silicon layer. In the LCD device of FIGS. 27 and 28, a width $W_7$ of the active pattern 417b is greater than a width $W_3$ of the data line 418a' so that sides of the active pattern 417b protrude from the data line 418a'. The source electrode 418a, the drain electrode 418c and the data line 418a' are formed on the active pattern 417b.

The passivation layer 416 is formed on the gate insulating layer 426 having the TFT 419, the active pattern 417b and the data line 418a', and has a contact hole and a groove 437b. In the LCD device of FIGS. 27 and 28, the passivation layer 416 has a plurality of grooves 437b. The drain electrode 418c is partially exposed through the contact hole, and the gate insulating layer 426 adjacent to the data line 418a' is exposed through the groove 437b. The pixel electrode 412 is spaced apart from the active patterns 417b to decrease an electromagnetic interference between the pixel electrode 412 and the data line 418a' on the active pattern 417b.

According to the LCD device of FIGS. 27 and 28, the pixel electrode 412 is spaced apart from the active pattern 417b by the grooves 437b to decrease an electromagnetic interference between the pixel electrode 412 and the active pattern 417b.

An LCD device was manufactured to test widths of a data line, an active pattern and a data line. Each of the skews is a recessed amount of the data line and the active pattern caused by an etching process. The LCD device of this example is substantially the same as in FIGS. 27 to 28. Thus, the same reference numerals will be used to refer to the same or like parts as those described in FIGS. 27 to 28 and any further explanation concerning the above elements will be omitted.

Referring to FIGS. 27 and 28, the gate electrode 418b, the gate line 418b' and the storage capacitor line 422 were formed on the lower substrate 420. The gate insulating layer 426 was deposited on the lower substrate 420 having the gate electrode 418b, the gate line 418b' and the storage capacitor line 422. An active layer and a molybdenum layer were formed on the gate insulating layer 426.

Photoresist patterns were formed on the molybdenum layer. A width of the photoresist pattern corresponding to the data line 418a' was 8.8 μm.

The active layer and the molybdenum layer were partially etched using the photoresist patterns as an etching mask to form a primitive active layer, a primary data line and a primary source/drain electrode under the photoresist patterns. A width of the primary data line and a width of the active layer were 6.4 μm and 8.6 μm, respectively.

The primary source/drain electrode corresponding to the gate electrode 418b is partially etched to form the source electrode 418a and the drain electrode 418c.

Sides of the primary data line and the primary active layer were etched to form the data line 418a' and the primary active pattern while the primary source/drain electrode was partially etched. The width $W_3$ of the data line 418a' and the width of the primary active pattern under the data line 418a' were 4 μm and 8.5 μm, respectively.

The passivation layer 416 having a contact hole and grooves 437b was formed on the gate insulating layer 426 having the TFT 419, the data line 418a' and the primary active pattern. A width of the groove 437b was 1.5 μm, and a width $W_7$ of the active pattern 417b was 5.5 μm.

A pixel electrode 412 was formed on the passivation layer 416 and an inner surface of the contact hole. A distance between the pixel electrode 412 and the active pattern 417a was 3.6 μm, and a distance between the pixel electrode 412 and the data line 418a' was 4.5 μm.

The first substrate 470 having the upper substrate 400, the black matrix 402, the color filter 404 and the common electrode 406 was completed. The liquid crystal was injected into a space between the first and second substrates 470 and 480, and the liquid crystal was sealed by the sealant (not shown) to form the liquid crystal layer 408.

In FIGS. 27 and 28, the width $W_3$ of the data line 418a' and the distance between the active pattern 417b and the pixel electrode 412 were 4 μm and 3.6 μm, respectively.

Figure 29:
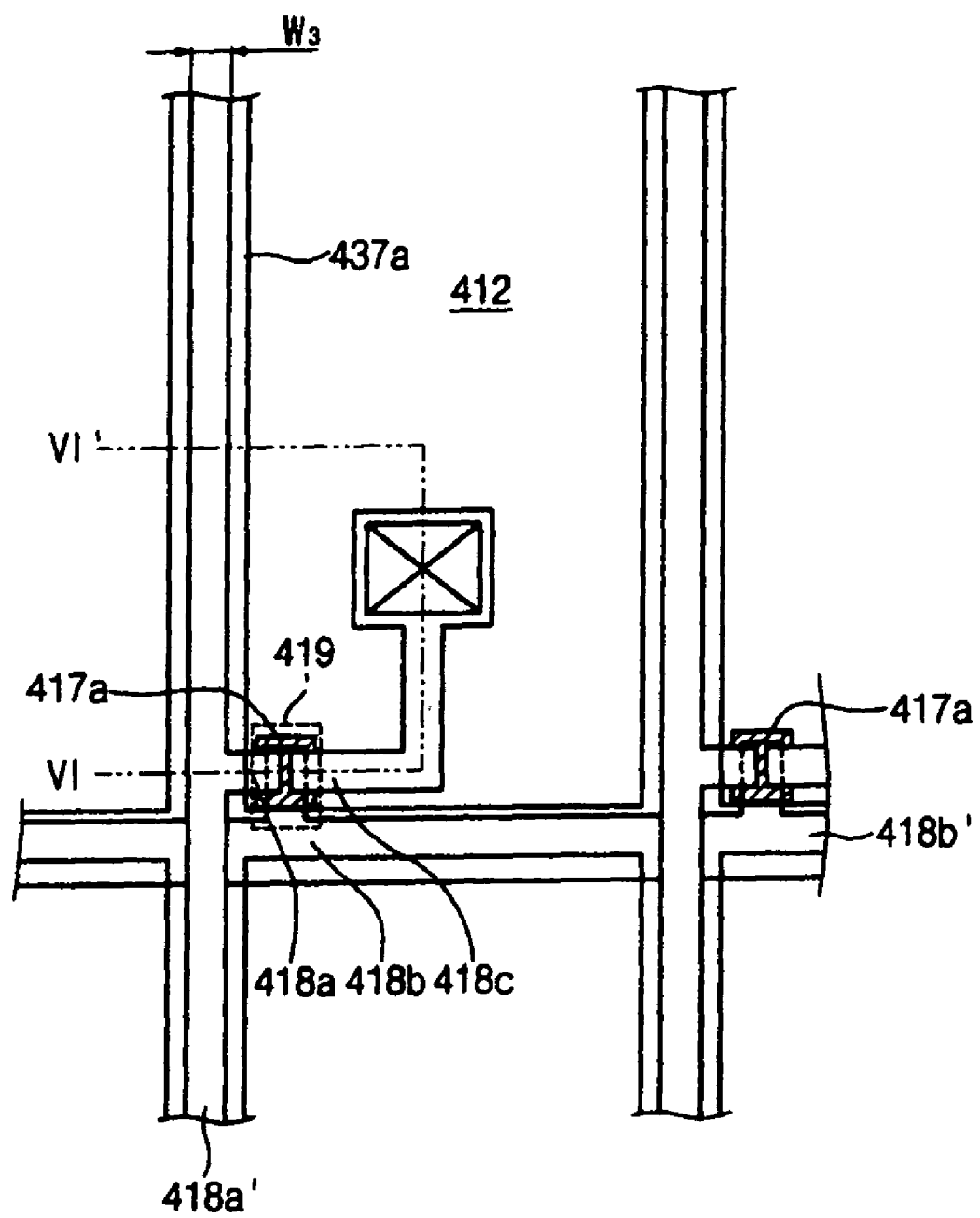
FIG. 29 is a plan view showing an LCD device in accordance with another embodiment of the present invention.
Figure 30:
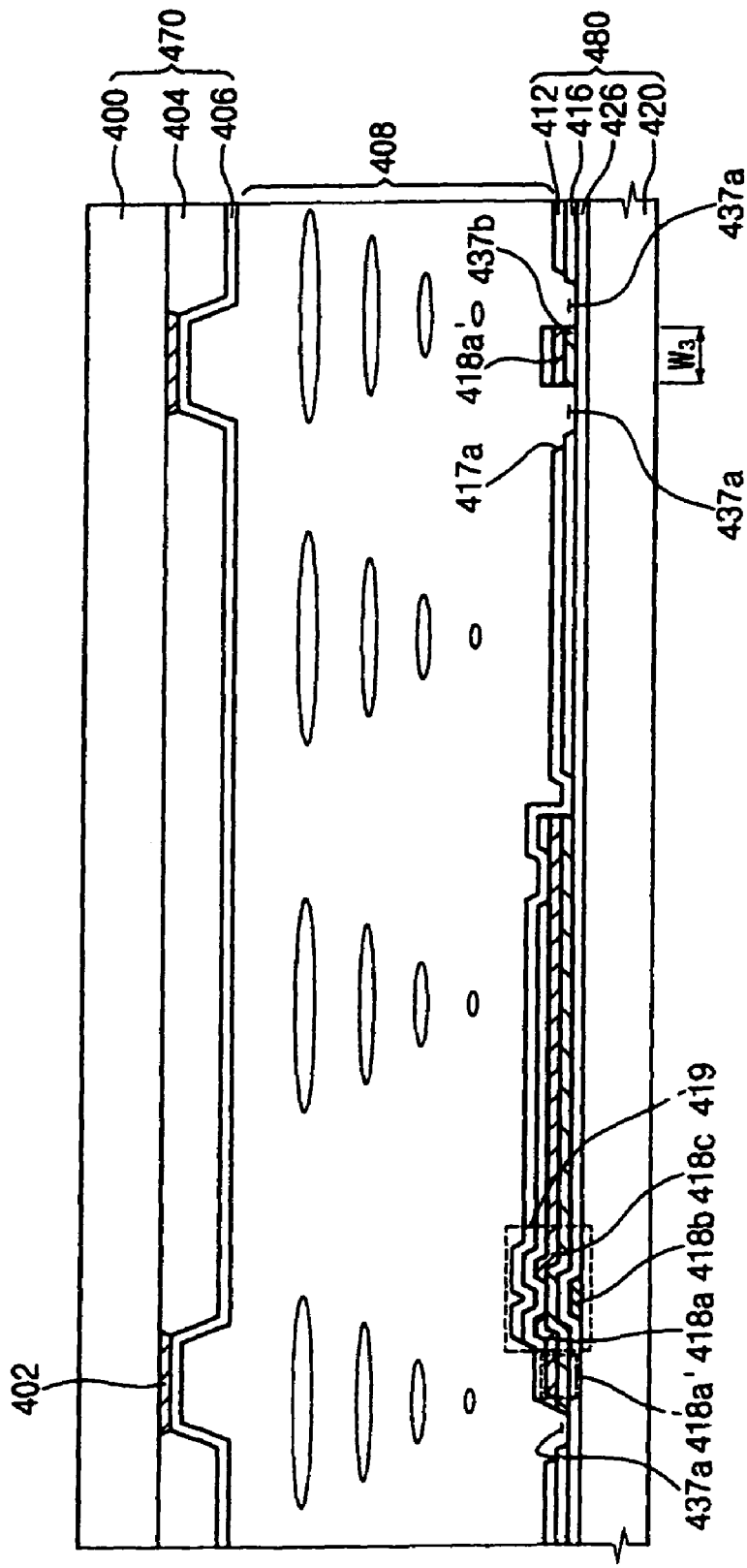
FIG. 30 is a cross-sectional view taken along a line VI-VI' shown in FIG. 29.

FIG. 29 is a plan view showing an LCD device in accordance with another embodiment of the present invention. FIG. 30 is a cross-sectional view taken along a line VI-VI' shown in FIG. 29. The LCD device of FIGS. 29 and 30 is substantially the same as in FIGS. 17 to 18 except for a storage capacitor, as will be described in greater detail below. Thus, the same reference numerals will be used to refer to the same or like parts as those described in FIGS. 17 to 18 and any further explanation concerning the above elements will be omitted.

Referring to FIGS. 29 and 30, the LCD device includes a first substrate 470, a second substrate 480, a spacer (not shown) and a liquid crystal layer 408.

The first substrate 470 includes an upper substrate 400, a black matrix 402, a color filter 404 and a common electrode 406.

The second substrate 480 includes a lower substrate 420, a thin film transistor (TFT) 419, a gate line 418b', a data line 418a', a storage capacitor 423, a gate insulating layer 426, an active pattern 417a, a passivation layer 416 and a pixel electrode 412. The gate and data lines 418b' and 418a' define a pixel.

The TFT 419 is provided in the pixel region of the lower substrate 420, and includes a source electrode 418a, a gate electrode 418b, a drain electrode 418c and a semiconductor layer pattern. In the LCD device of FIGS. 29 and 30, each of the source electrode 418a, the drain electrode 418c and the data line 418a' comprises, e.g., a molybdenum (Mo) layer, molybdenum-aluminum (Mo—Al) alloy layer, etc. These materials can be used alone or in combination. Alternatively, each of the source electrode 418a, the drain electrode 418c and the data line 418a' may comprise a multi-layered structure having at least one molybdenum layer and at least one aluminum layer.

An upper portion of the pixel electrode 412 is overlaps with the gate line 418b' to form the storage capacitor 423.

According to the LCD device of FIGS. 29 and 30, a storage capacitor line is omitted so that an opening rate of the LCD device is increased.

Figure 31:
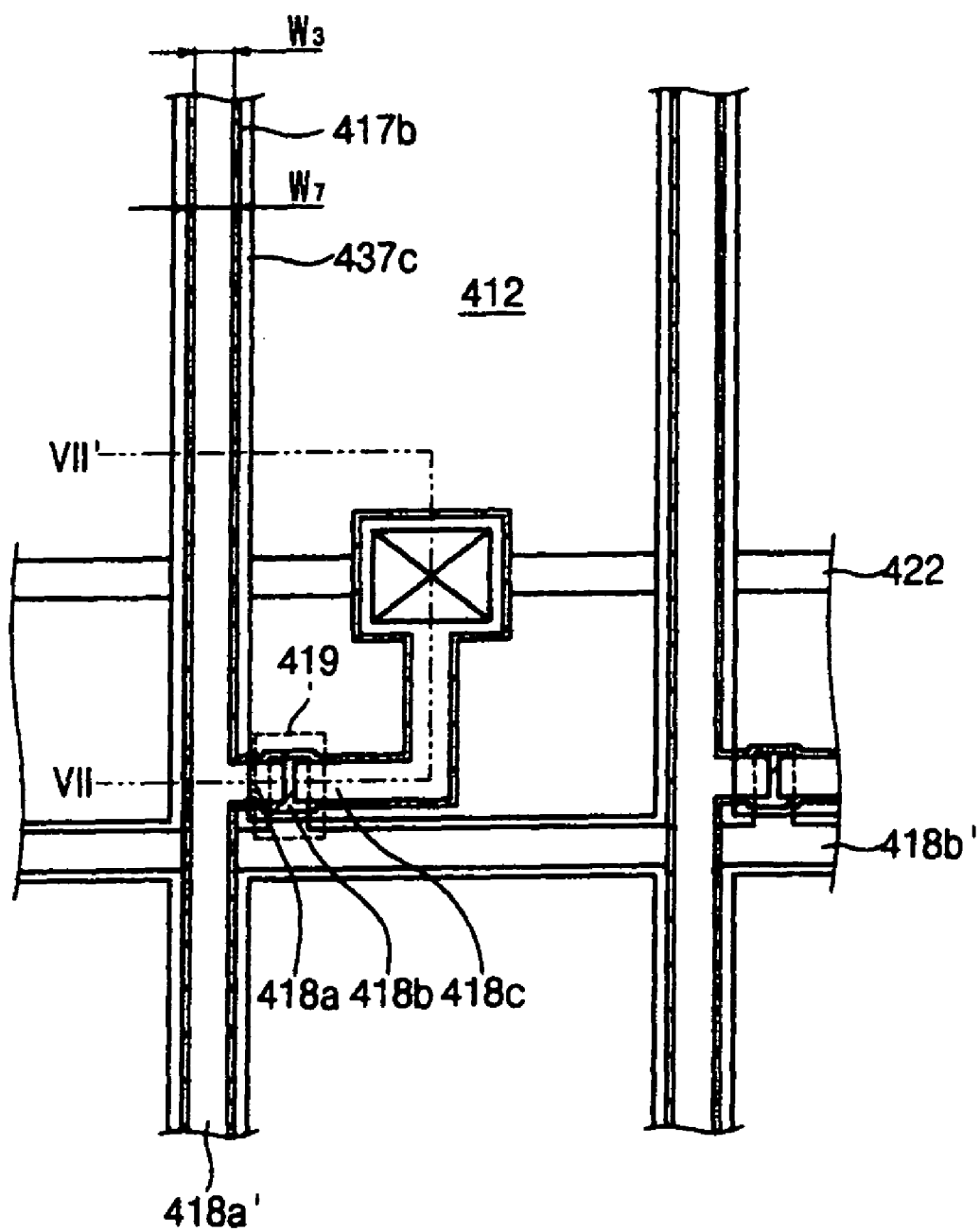
FIG. 31 is a plan view showing an LCD device in accordance with another embodiment of the present invention.
Figure 32:
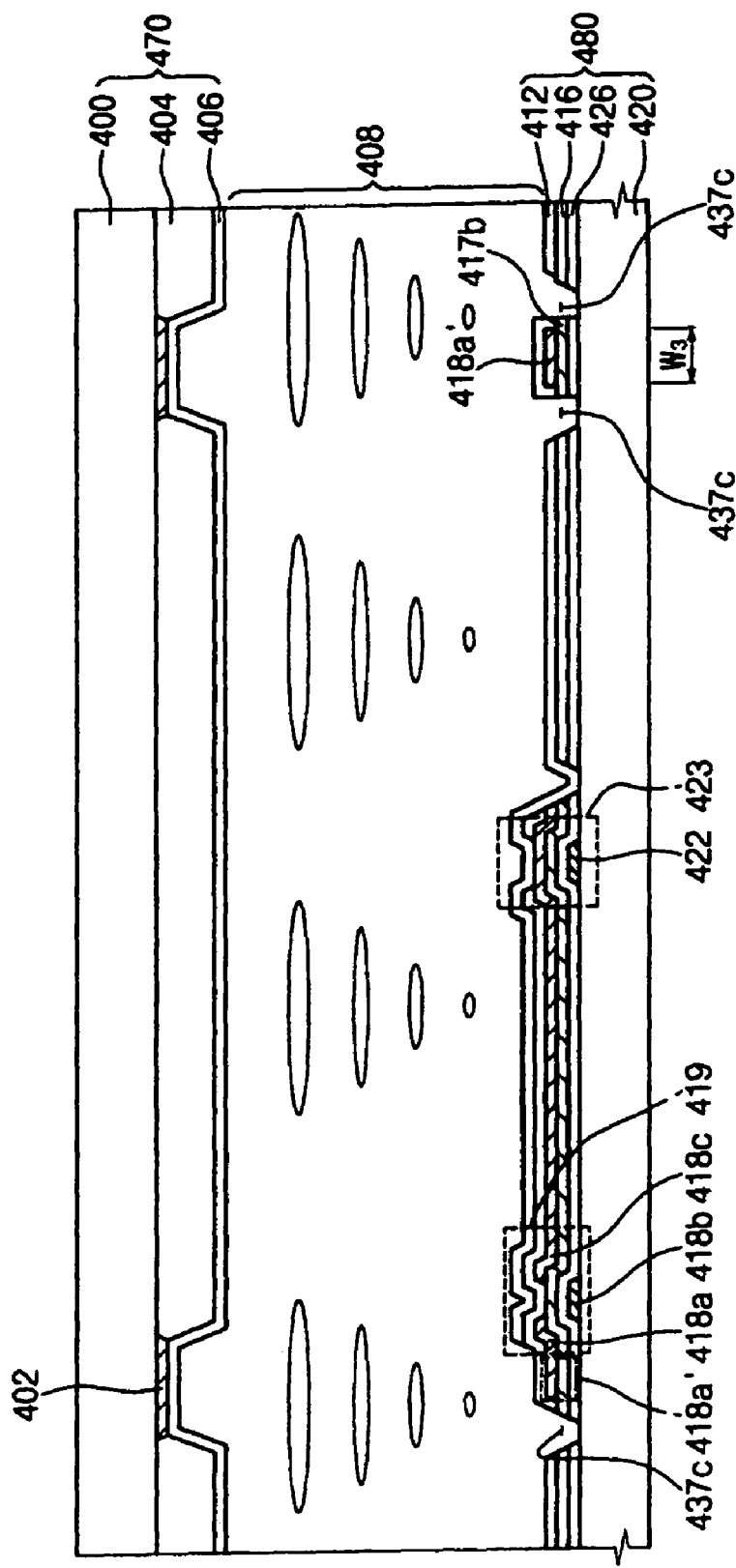
FIG. 32 is a cross-sectional view taken along a line VII-VII' shown in FIG. 31.

FIG. 31 is a plan view showing an LCD device in accordance with another embodiment of the present invention. FIG. 32 is a cross-sectional view taken along a line VII-VII' shown in FIG. 31. The LCD device of FIGS. 31 and 32 is substantially the same as in FIGS. 27 to 28 except for a groove, as will be described in greater detail below. Thus, the same reference numerals will be used to refer to the same or like parts as those described in FIGS. 27 to 28 and any further explanation concerning the above elements will be omitted.

Referring to FIGS. 31 and 32, the LCD device includes a first substrate 470, a second substrate 480, a spacer (not shown) and a liquid crystal layer 408.

The first substrate 470 includes an upper substrate 400, a black matrix 402, a color filter 404 and a common electrode 406.

The second substrate 480 includes a lower substrate 420, a thin film transistor (TFT) 419, a gate line 418b', a data line 418a', a storage capacitor 423, a storage capacitor line 422, a gate insulating layer 426, an active pattern 417b, a passivation layer 416 and a pixel electrode 412. The gate and data lines 418b' and 418a' define a pixel.

The TFT 419 is provided in the pixel region of the lower substrate 420, and includes a source electrode 418a, a gate electrode 418b, a drain electrode 418c and a semiconductor layer pattern. In the LCD device of FIGS. 31 and 32, each of the source electrode 418a, the drain electrode 418c and the data line 418a' comprises, e.g., a molybdenum (Mo) layer, molybdenum-aluminum (Mo—Al) alloy layer, etc. These materials can be used alone or in combination. Alternatively, each of the source electrode 418a, the drain electrode 418c and the data line 418a' may comprise a multi-layered structure having at least one molybdenum layer and at least one aluminum layer.

The gate insulating layer 426 is formed on the lower substrate 420 having the gate electrode 418b and the storage capacitor line 422 so that the gate electrode 418b and the storage capacitor line 422 are electrically insulated from the source electrode 418a and the drain electrode 418c.

The active pattern 417b is formed on the gate insulating layer 426, and comprises an amorphous silicon layer and an N+ amorphous silicon layer on the amorphous silicon layer.

In the LCD device of FIGS. 31 and 32, a width $W_7$ of the active pattern 417b is greater than a width $W_3$ of the data line 418a' so that sides of the active pattern 417b protrude from the data line 418a'. The source electrode 418a, the drain electrode 418c and the data line 418a' are formed on the active pattern 417b.

The passivation layer 416 is formed on the gate insulating layer 426 having the TFT 419, the active pattern 417b and the data line 418a', and has a contact hole through which the drain electrode 418c is partially exposed.

The gate insulating layer 426 and the passivation layer 416 further comprise a plurality of grooves 437c through which the lower substrate 420 is partially exposed. A width of each of the grooves 437c is controlled to decrease an electromagnetic interference between the gate line 418a' and the pixel electrode 412.

According to the LCD device of FIGS. 31 and 32, the grooves 437c are formed through the gate insulating layer 426 and the passivation layer 416, so that the lower substrate 420 may function as an etch stop layer to simplify a manufacturing process of the LCD device.

According to embodiments of the present invention, the data line, the source electrode, the drain electrode and the active pattern are formed using the same mask, thereby simplifying the manufacturing process of the LCD device.

In addition, the data line comprises molybdenum, which has a lower electrical resistance than chromium, to decrease the electrical resistance of the data line, thereby improving the image display quality of the LCD device.

Furthermore, the active pattern between the data line and the pixel electrode is provided to decrease the electromagnetic interference between the pixel electrode and the data line so that the width of the data line may be increased. Also, the active pattern between the data line and the pixel electrode may be removed without any additional processing to simplify the manufacturing process of the LCD device and to thereby decrease the manufacturing cost of the LCD device.

This invention has been described with reference to the embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A substrate for a display device comprising:
an insulating substrate having a switching element;
a data line on the insulating substrate to be electrically connected to a first electrode of the switching element;
an insulating layer on the insulating substrate, the insulating layer having a contact hole through which a second electrode of the switching element is partially exposed and a groove adjacent to the data line, the groove passing through the insulating layer, a portion of the insulating layer covering the data line; and
a pixel electrode on the insulating layer electrically connected to the second electrode through the contact hole.

2. The substrate of claim 1, further comprising active patterns under the data line, the first and second electrodes, and a region between the first and second electrodes.

3. The substrate of claim 2, wherein each of the active patterns comprises an amorphous silicon layer and an N+ amorphous silicon layer on the amorphous silicon layer.

4. The substrate of claim 2, wherein the data line has a width substantially equal to a width of the active pattern.

5. The substrate of claim 2, wherein a width of the data line is less than a width of the active pattern.

6. The substrate of claim 1, wherein each of the first and second electrodes and the data line comprises a molybdenum layer, a molybdenum alloy layer, or a multi-layered structure having at least one molybdenum layer and at least one aluminum layer.

7. The substrate of claim 6, wherein the multi-layered structure comprises a first molybdenum layer, an aluminum layer on the first molybdenum layer, and a second molybdenum layer on the aluminum layer.

8. The substrate of claim 1, wherein the insulating substrate is partially exposed through the groove.

9. The substrate of claim 1, wherein:
the switching element further comprises a control electrode;
the insulating substrate further comprises a gate insulating layer on the control electrode such that the control electrode is electrically insulated from the data line and the first and second electrodes; and
the gate insulating layer is partially exposed through the groove.

10. A method of manufacturing a substrate for a display device, comprising:
forming a switching element and a data line on an insulating substrate, the data line being electrically connected to a first electrode of the switching element;
forming an insulating layer having a contact hole through which a second electrode of the switching element is partially exposed and a groove adjacent to the data line on the insulating substrate, the groove passing through the insulating layer; and
forming a pixel electrode electrically connected to the second electrode through the contact hole on the insulating layer,
wherein forming the switching element and the data line comprises forming an active pattern between the first and second electrodes, and
wherein the insulating layer is formed by:
depositing an insulating material on the insulating substrate having the switching element and the data line;
removing a portion of the deposited insulating material corresponding to the second electrode; and
removing the deposited insulating material adjacent to the data line and the active pattern adjacent to the data line, and
wherein the deposited insulating material corresponding to the second electrode, the deposited insulating material adjacent to the data line, and the active pattern adjacent to the data line are removed through the same process.

11. The method of claim 10, wherein the insulating layer is formed using a first mask having a first reticle corresponding to the contact hole and a second reticle corresponding to the groove.

12. The method of claim 11, wherein a side of the second reticle corresponds to a side of the data line.

13. The method of claim 10, wherein the switching element and the data line are formed by:
forming a control electrode of the switching element and a gate line that is electrically connected to the control electrode on the insulating substrate;
forming a gate insulating layer on the insulating substrate having the control electrode and the gate line;
forming the active pattern comprises:
depositing amorphous silicon on the gate insulating layer; and
implanting impurities on an upper portion of the deposited amorphous silicon;

depositing molybdenum on the implanted amorphous silicon; and partially removing the deposited molybdenum, the implanted amorphous silicon, and a remaining portion of the deposited amorphous silicon.

14. The method of claim 13, wherein the deposited molybdenum, the implanted amorphous silicon and the remaining portion of the deposited amorphous silicon are partially removed using a second mask.

15. The method of claim 14, further comprising forming a plurality of pixel electrodes, and wherein the second mask comprises a third reticle corresponding to the data line and a fourth reticle corresponding to the first and second electrodes, and a width of the third reticle is substantially equal to a distance between adjacent pixel electrodes.

16. A liquid crystal display device comprising:
a first substrate;
a second substrate corresponding to the first substrate, the second substrate comprising:
a lower substrate;
a switching element on the lower substrate;
a data line on the lower substrate electrically connected to a first electrode of the switching element;
an insulating layer on the lower substrate, the insulating layer having a contact hole through which a second electrode of the switching element is partially exposed and a groove adjacent to the data line, the groove passing through the insulating layer, a portion of the insulating layer covering the data line; and
a pixel electrode on the insulating layer electrically connected to the second electrode through the contact hole; and
a liquid crystal layer interposed between the first and second substrates.

17. The liquid crystal display device of claim 16, further comprising a storage capacitor on the lower substrate to maintain a voltage difference between a common electrode of the first substrate and the pixel electrode of the second substrate.

18. The liquid crystal display device of claim 17, wherein:
the second substrate further comprises a storage capacitor line that receives a common voltage; and
the storage capacitor line partially overlaps with the pixel electrode to form the storage capacitor.

19. The liquid crystal display device of claim 17, wherein the pixel electrode is overlapped with a portion of a gate line that is electrically connected to a control electrode of the switching element to form the storage capacitor.

20. The liquid crystal display device of claim 16, wherein the second substrate further comprises active patterns that are under the data line, the first and second electrodes and a region between the first and second electrodes.

21. The liquid crystal display device of claim 16, wherein each of the first and second electrodes and the data line comprises a molybdenum layer, a molybdenum alloy layer, or a multi-layered structure having at least one molybdenum layer and at least one aluminum layer.

22. A method of manufacturing a liquid crystal display device, comprising:
forming a switching element and a data line that is electrically connected to a first electrode of the switching element on a lower substrate;
forming on the lower substrate having the switching element and the data line an insulating layer having a contact hole through which a second electrode of the switching element is partially exposed and a groove adjacent to the data line, the groove passing through the insulating layer;
forming a pixel electrode electrically connected to the second electrode through the contact hole in the insulating layer;
forming an upper substrate corresponding to the lower substrate; and
interposing a liquid crystal layer between the pixel electrode and the upper substrate,
wherein forming the switching element and the data line comprises forming an active pattern between the first and second electrodes, and
wherein the insulating layer is formed by:
depositing an insulating material on the insulating substrate having the switching element and the data line;
removing a portion of the deposited insulating material corresponding to the second electrode; and
removing the deposited insulating material adjacent to the data line and the active pattern adjacent to the data line, and
wherein the deposited insulating material corresponding to the second electrode, the deposited insulating material adjacent to the data line, and the active pattern adjacent to the data line are removed through the same process.

* * * * *